(12) United States Patent
Choi et al.

(10) Patent No.: US 10,930,209 B2
(45) Date of Patent: Feb. 23, 2021

(54) STRETCHABLE DISPLAY DEVICE, PANEL DRIVING CIRCUIT AND THE METHOD OF DRIVING THE SAME

(71) Applicant: LG DISPLAY CO., LTD., Seoul (KR)

(72) Inventors: Wonjin Choi, Seoul (KR); GeeSung Chae, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/433,430

(22) Filed: Jun. 6, 2019

(65) Prior Publication Data

US 2019/0378456 A1 Dec. 12, 2019

(30) Foreign Application Priority Data

Jun. 8, 2018 (KR) .................. 10-2018-0066264

(51) Int. Cl.
*G09G 3/3225* (2016.01)
*G09G 3/36* (2006.01)
(Continued)

(52) U.S. Cl.
CPC ..... *G09G 3/3225* (2013.01); *G02F 1/133305* (2013.01); *G09G 3/3648* (2013.01); *H05K 1/0283* (2013.01); *G09G 2310/0264* (2013.01)

(58) Field of Classification Search
CPC .............. G09G 3/3225; G09G 3/3648; G09G 2310/0264; G09G 3/20; G09G 2320/029; G09G 2300/0426; G09G 2320/0223; G09G 3/36; G09G 3/3208; G09G 2310/08; G09G 2320/0233; G09G 2380/02;
(Continued)

(56) References Cited

U.S. PATENT DOCUMENTS 8,947,354 B2 * 2/2015 Kim .................. G06F 3/033
345/156
9,069,378 B2 * 6/2015 Cho .................. G06F 3/0488
(Continued)

FOREIGN PATENT DOCUMENTS

JP 2010224092 A 10/2010
JP 2015082063 A 4/2015
(Continued)

OTHER PUBLICATIONS

Taiwanese Office Action dated Feb. 27, 2020 issued in corresponding Patent Application No. 108119528 (10 pages).

*Primary Examiner* — Benyam Ketema
(74) *Attorney, Agent, or Firm* — Polsinelli PC

(57) ABSTRACT

A display device includes a stretchable display panel that includes a plurality of lines and a plurality of subpixels; a driving circuit that drives the plurality of lines; a controller that controls the driving circuit; and a sensing circuit that sends a time constant related value including at least one of a resistance value, a capacitance value and a time constant value of the plurality of lines, and that outputs the sensed time constant related value, wherein the controller controls a timing for driving at least one of the plurality of lines, or controls characteristics of a signal supplied to at least one of the plurality of lines to be changed in accordance with the time constant related value obtained by sensing at least one of the plurality of lines when the stretchable display panel is stretched.

28 Claims, 20 Drawing Sheets

(51) Int. Cl.
*G02F 1/1333* (2006.01)
*H05K 1/02* (2006.01)

(58) Field of Classification Search
CPC ... G02F 1/133305; G02F 2001/134345; G02F 1/13306; H05K 1/0283; G09F 9/301; G06F 1/1652; H01L 27/3276; H01L 51/0097; H01L 2251/5338
See application file for complete search history.

(56) References Cited

U.S. PATENT DOCUMENTS

| | | | | |
|---|---|---|---|---|
| 9,983,628 | B2* | 5/2018 | Kim | G06F 1/1652 |
| 10,261,682 | B2* | 4/2019 | Seo | G06F 3/0487 |
| 2003/0227441 | A1* | 12/2003 | Hioki | G06F 3/0414 |
| | | | | 345/156 |
| 2010/0164888 | A1* | 7/2010 | Okumura | G06F 3/04883 |
| | | | | 345/173 |
| 2011/0227822 | A1* | 9/2011 | Shai | G06T 3/40 |
| | | | | 345/156 |
| 2014/0028597 | A1* | 1/2014 | Cho | G06F 1/1652 |
| | | | | 345/173 |
| 2016/0025669 | A1* | 1/2016 | Sun | G01N 27/305 |
| | | | | 205/790.5 |
| 2016/0077553 | A1 | 3/2016 | Hyun | |
| 2016/0109973 | A1* | 4/2016 | Kim | G06F 1/1643 |
| | | | | 345/173 |
| 2016/0147327 | A1 | 5/2016 | Choi et al. | |
| 2016/0320878 | A1 | 11/2016 | Hong et al. | |
| 2017/0249886 | A1 | 8/2017 | Choi | |
| 2018/0090091 | A1* | 3/2018 | Sim | G09G 3/3266 |
| 2018/0114491 | A1 | 4/2018 | Tokuda | |

FOREIGN PATENT DOCUMENTS

| | | |
|---|---|---|
| JP | 2018066933 A | 4/2018 |
| TW | 201120720 A1 | 6/2011 |
| TW | 201137826 A1 | 11/2011 |
| TW | 201415452 A | 4/2014 |
| TW | I584626 B | 5/2017 |
| TW | 201814682 A | 4/2018 |

* cited by examiner

S/A : Stretchable Area

S/A : Stretchable Area

S/A : Stretchable Area

STRETCHABLE DISPLAY DEVICE, PANEL DRIVING CIRCUIT AND THE METHOD OF DRIVING THE SAME

CROSS-REFERENCE TO RELATED APPLICATION

This application claims the priority benefit of Korean Patent Application No. 10-2018-00066264, filed on Jun. 8, 2018 in the Korean Intellectual Property Office, the disclosure of which is incorporated herein by reference in its entirety.

BACKGROUND

Field of the Disclosure

The present disclosure relates to a stretchable display device, a panel driving circuit for driving a stretchable display panel, and a method of driving the display device or the panel driving circuit.

Description of the Background

As the advent of information society, there have been growing needs for various display panels for using in display devices, lighting devices, or the like. Recently, a range of display devices, such as a liquid crystal display (LCD), a plasma display panel (PDP), and an organic light emitting display (OLED) devices, or the like, have been developed and utilized.

Along with the development of technology, there has been increasing demands for various types of display device, such as bendable, flexible, rollable, and foldable display devices. Furthermore, there is a demand for a display device that can be extended or reduced, that is, changed into a different size.

Despite the needs for such a stretchable display device, since there is a problem that display quality of images can be degraded as the display panel is stretched. Therefore, there are substantial difficulties in implementing a stretchable display device in fact.

SUMMARY

Accordingly, the present disclosure is directed to a stretchable display device, a panel driving circuit capable of driving a stretchable display panel and a method of driving the display device or the panel driving circuit which substantially obviate one or more problems due to limitations and disadvantages of the prior art.

Additional features and advantages of the disclosure will be set forth in the description which follows and in part will be apparent from the description, or may be learned by practice of the disclosure. Other advantages of the disclosure will be realized and attained by the structure particularly pointed out in the written description and claims hereof as well as the appended drawings.

The present disclosure provides a stretchable display device, a panel driving circuit capable of driving a stretchable display panel, and a method of driving the display device or the panel driving circuit, for enabling original display quality of images to be maintained even when the display device or the display panel is stretched.

The present disclosure provides a stretchable display device, a panel driving circuit capable of driving a stretchable display panel, and a method of driving the display device or the panel driving circuit, for enabling signal delivering performance of stretched lines to be maintained, even when the lines disposed in the display panel is stretched, in case the display device or the display panel is stretched.

The present disclosure provides a stretchable display device, a panel driving circuit capable of driving a stretchable display panel, and a method of driving the display device or the panel driving circuit, for enabling signal delivering performance of stretched lines to be maintained equally without a difference in signal delivering performance between the lines, even when there is a difference in whether the lines can be stretched or in how much the lines can be stretched according to a stretched location or a stretched direction of the display device or the display panel, in case the display device or the display panel is stretched.

In accordance with an aspect of the present disclosure, A display device comprising: stretchable display panel that includes a plurality of lines and a plurality of subpixels, and that is stretchable; a driving circuit driving the plurality of lines; a sensing circuit sensing a time constant related value of the plurality of lines, and outputting the sensed time constant related value; and a controller controlling the driving circuit, and controlling a timing for driving all or at least one of the plurality of lines, or controlling characteristics of a signal supplied to all or at least one of the plurality of lines to be changed according to the time constant related value obtained by sensing all or at least one of the plurality of lines, when the display panel has been stretched.

The time constant related value includes at least one of a resistance value, a capacitance value, and a time constant value of all or at least one of the plurality of lines.

The plurality of lines are formed of a stretchable material.

The characteristics of the signal is a magnitude of a normal voltage, a magnitude of an over-drive voltage or a magnitude of an under-drive voltage.

In case of an individual sensing scheme, the time constant related value includes at least one of a resistance value, a capacitance value, and a time constant value of each of all or at least one of the plurality of lines.

In case of a group sensing scheme, the time constant related value includes at least one of a resistance value, a capacitance value, and a time constant value of each group for all or at least one of the plurality of lines.

The at least one of the plurality of lines includes a first line that is stretched with the display panel, wherein the sensing circuit outputs a first time constant related value obtained by sensing the first line, wherein the controller compares the first time constant related value with a first reference time constant value, outputs a control signal for enabling the driving circuit to drive the first line at an earlier timing than a reference driving timing when the first time constant related value is larger than the first reference time constant value, and outputs a control signal for enabling the driving circuit to drive the first line at a later timing than the reference driving timing when the first time constant related value is smaller than the first reference time constant value.

The all or at least one of the plurality of lines includes a first line that is stretched with the display panel, wherein the sensing circuit outputs a first time constant related value obtained by sensing the first line, wherein the controller compares the first time constant related value with a first reference time constant value, controls the driving circuit to increase a magnitude of a signal to be supplied to the first line, the signal to be supplied to the first line by the driving circuit to be over-driven, or the driving circuit to increase an over-drive voltage of the signal to be supplied to the first line when the first time constant related value is larger than the first reference time constant value, and controls the driving circuit to reduce the magnitude of the signal to be supplied to the first line, the signal to be supplied to the first line by the driver circuit not to be over-driven, or the driving circuit to reduce the over-drive voltage of the signal to be supplied to the first line when the first time constant related value is smaller than the first reference time constant value.

The all or at least one of the plurality of lines includes a first line and a second line that are stretched with the display panel, wherein the sensing circuit outputs a first time constant related value obtained by sensing the first line, and a second time constant related value obtained by sensing the second line, and wherein the first time constant related value is larger than the second time constant related value, the controller outputs a control signal for enabling the driving circuit to drive the first line at an earlier timing than the second line.

The all or at least one of the plurality of lines includes a first line and a second line that are stretched with the display panel, wherein the sensing circuit outputs a first time constant related value obtained by sensing the first line, and a second time constant related value obtained by sensing the second line, and wherein the controller controls a magnitude of a signal to be supplied to the first line to be larger than a magnitude of a signal to be supplied to the second line, the signal to be supplied to the first line to be over-driven and a signal to be supplied to the second line not to be over-driven, or an over-drive voltage of the signal to be supplied to the first line to be larger than an over-drive voltage of the signal to be supplied to the second line when the first time constant related value is larger than the second time constant related value.

Each of the plurality of subpixels includes: an organic light emitting diode; a driving transistor electrically connected between the first electrode of the organic light emitting diode and a driving voltage line; and a first transistor controlled by a scan signal supplied through a gate line, and electrically connected between a gate node of the driving transistor and a data line, wherein each of the all or at least one of the plurality of lines is one of the data line, the driving voltage line and the gate line.

The all or at least one of the plurality of lines include a first data line and a second data line, and the display device further includes: a first sensing enable switch for changing a connection state between the first data line and the sensing circuit according to a sensing enable signal; a second sensing enable switch for changing a connection state between the second data line and the sensing circuit according to the sensing enable signal; a first driving enable switch for changing a connection state between the first data line and a first output buffer in the driving circuit; and a second driving enable switch for changing a connection state between the second data line and a second output buffer in the driving circuit, wherein on-off states of the first driving enable switch and the second driving enable switch are opposite of on-off states of the first sensing enable switch and the second sensing enable switch.

The all or at least one of the plurality of lines include a first data line and a second data line, and the display device further includes: a first sensing enable switch for changing a connection state between the first data line and the second data line according to the sensing enable signal; a second sensing enable switch for changing a connection state between the first data line or the second data line and the sensing circuit according to the sensing enable signal, a first driving enable switch for changing a connection state between the first data line and the first output buffer in the driving circuit; and a second driving enable switch for changing a connection state between the second data line and the second output buffer in the driving circuit, wherein on-off states of the first driving enable switch and the second driving enable switch are opposite of on-off states of the first sensing enable switch and the second sensing enable switch.

The display device further includes an inverter circuit electrically connected between gate nodes of the first driving enable switch and the second driving enable switch and gate nodes of the first sensing enable switch and the second sensing enable switch.

The display panel has a symmetrical structure.

In accordance with another aspect of the present disclosure, a method of driving a stretchable display device including a display panel including a plurality of lines, and a driving circuit for driving the plurality of lines, the method comprising: sensing a time constant related value of all or at least one of the plurality of lines, at a line sensing step; and controlling a timing for driving the all or at least one of the plurality of lines or controlling characteristics of a signal supplied to the all or at least one of the plurality of lines to be changed, at a driving control step when the display panel is stretched according to the time constant related value obtained by sensing at least one of the plurality of lines.

The time constant related value includes at least one of a resistance value, a capacitance value, and a time constant value of all or at least one of the plurality of lines.

The method further comprising: prior to the line sensing step, generating a stretch event signal by sensing whether the display panel is stretched or a stretched location based on an input signal, at a display panel stretch sensing step.

The line sensing step comprises selectively sensing one or more lines corresponding to the stretched location sensed in the display panel stretch sensing step.

The method further comprising: after the line sensing step, determining whether the display panel is stretched or determining a location where the display panel is stretched, based on the time constant related value obtained by sensing the all or at least one of the plurality of lines, at a display panel stretch determination step.

In the line sensing step, the time constant related value of all or at least one of the plurality of lines includes a first time constant related value of a first line that is stretched with the display panel, wherein the driving control step further comprises: comparing the first time constant related value with a first reference time constant value; outputting a control signal for enabling the driving circuit to drive the first line at an earlier timing than a reference driving timing when the first time constant related value is larger than the first reference time constant value; and outputting a control signal for enabling the driving circuit to drive the first line at a later timing than the reference driving timing when the first time constant related value is smaller than the first reference time constant value.

In the line sensing step, the time constant related value of all or at least one of the plurality of lines includes a first time constant related value of a first line that is stretched with the display panel, wherein the driving control step further comprises: comparing the first time constant related value with a first reference time constant value; when the first time constant related value is larger than the first reference time constant value, controlling a magnitude of a signal to be supplied to the first line to be larger, the signal to be supplied to the first line to be over-driven, or an over-drive voltage of the signal to be supplied to the first line to be larger; and when the first time constant related value is smaller than the first reference time constant value, controlling □) the magnitude of the signal to be supplied to the first line to be smaller, ☐) the signal to be supplied to the first line not to be over-driven, or ☐) the over-drive voltage of the signal to be supplied to the first line to be smaller.

In the line sensing step, the time constant related value of all or at least one of the plurality of lines includes a first time constant related value obtained by sensing a first line and a second time constant related value obtained by sensing a second line, wherein the driving control step further comprises: outputting a control signal for enabling the driving circuit to drive the first line at an earlier timing than the second line when the first time constant related value is larger than the second time constant related value.

In the line sensing step, the time constant related value of all or at least one of the plurality of lines includes a first time constant related value obtained by sensing a first line and a second time constant related value obtained by sensing a second line, wherein the driving control step further comprises: controlling a magnitude of a signal to be supplied to the first line to be larger than a magnitude of a signal to be supplied to the second line, the signal to be supplied to the first line to be over-driven and a signal to be supplied to the second line not to be over-driven, or an over-drive voltage of the signal to be supplied to the first line to be larger than an over-drive voltage of the signal to be supplied to the second line when the first time constant related value is larger than the second time constant related value.

In accordance with further another aspect of the present disclosure, A panel driving circuit for driving a stretchable display panel comprising: a sensing circuit sensing a time constant related value of all or at least one of a plurality of lines disposed in the display panel; and a driving circuit that supplies a signal to the at least one of the plurality of lines at a changed timing depending on the time constant related value obtained by sensing the at least one of the plurality of lines, or that supplies, to the at least one of the plurality of line, the signal with changed characteristics depending on the time constant related value obtained by sensing the all or at least one of the plurality of lines.

The time constant related value includes at least one of a resistance value, a capacitance value, and a time constant value of all or at least one of the plurality of lines.

The driving circuit outputs the signal at the at least one of the plurality of lines that has a large time constant related value due to the stretching of the display panel at an earlier timing than the signal before the stretching of the display panel.

The driving circuit outputs the signal at the at least one of the plurality of lines that has a large time constant related value due to stretching of the display panel, with a larger strength than before the stretching of the display panel.

the driving circuit outputs the signal at the at least one of the plurality of lines that has a large time constant related value due to stretching of the display panel, with a larger over-drive voltage than before the stretching of the display panel.

In accordance with aspects of the present disclosure, it is possible to provide a stretchable display device, a panel driving circuit capable of driving a stretchable display panel, and a method of driving the display device or the panel driving circuit, for enabling original display quality of images to be maintained even when the display device or the display panel is stretched.

In accordance with aspects of the present disclosure, it is possible to provide a stretchable display device, a panel driving circuit capable of driving a stretchable display panel, and a method of driving the display device or the panel driving circuit, for enabling signal delivering performance of stretched lines to be maintained, even when the lines disposed in the display panel is stretched, in case the display device or the display panel is stretched.

In accordance with aspects of the present disclosure, it is possible to provide a stretchable display device, a panel driving circuit capable of driving a stretchable display panel, and a method of driving the display device or the panel driving circuit, for enabling signal delivering performance of stretched lines to be maintained equally without a difference in signal delivering performance between the lines, even when there occurs a difference in whether the lines can be stretched or in how much the lines can be stretched according to a stretched location or a stretched direction of the display device or the display panel, in case the display device or the display panel is stretched.

It is to be understood that both the foregoing general description and the following detailed description are exemplary and explanatory and are intended to provide further explanation of the disclosure as claimed.

DETAILED DESCRIPTION

Figure 1:
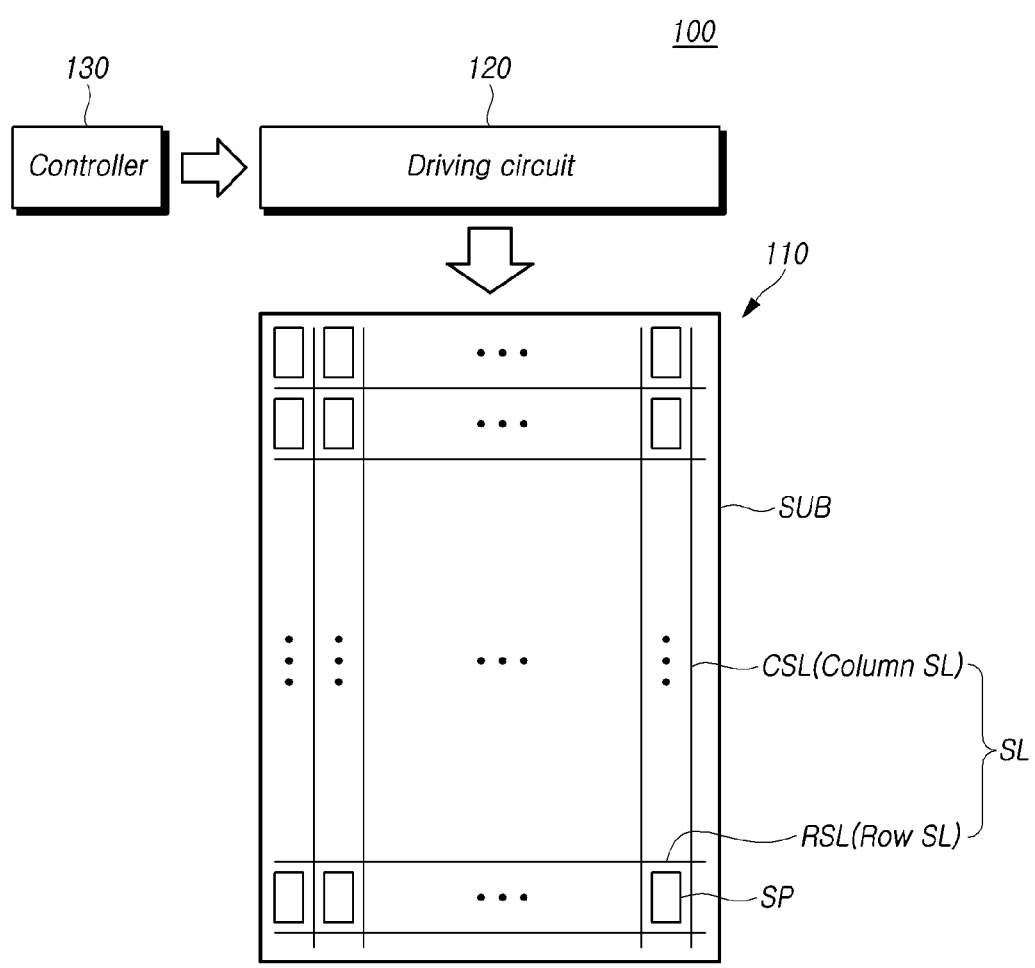
FIGS. 1 and 2 are block diagrams illustrating a schematic configuration of a stretchable display device according to aspects of the present disclosure.

Hereinafter, the aspects of the present disclosure will be described in detail with reference to the accompanying drawings. In denoting elements of the drawings by reference numerals, the same elements will be referenced by the same reference numerals although the elements are illustrated in different drawings. In the following description of the disclosure, detailed description of known functions and configurations incorporated herein may be omitted when it may make the subject matter of the disclosure rather unclear.

Terms, such as first, second, A, B, (A), or (B) may be used herein to describe elements of the disclosure. Each of the terms is not used to define essence, order, sequence, or number of an element, but is used merely to distinguish the corresponding element from another element. When it is mentioned that an element is "connected" or "coupled" to another element, it should be interpreted that another element may be "interposed" between the elements or the elements may be "connected" or "coupled" to each other via another element as well as that one element is directly connected or coupled to another element. Further, the term "may" fully encompasses all the meanings of the term "can".

Figure 2:
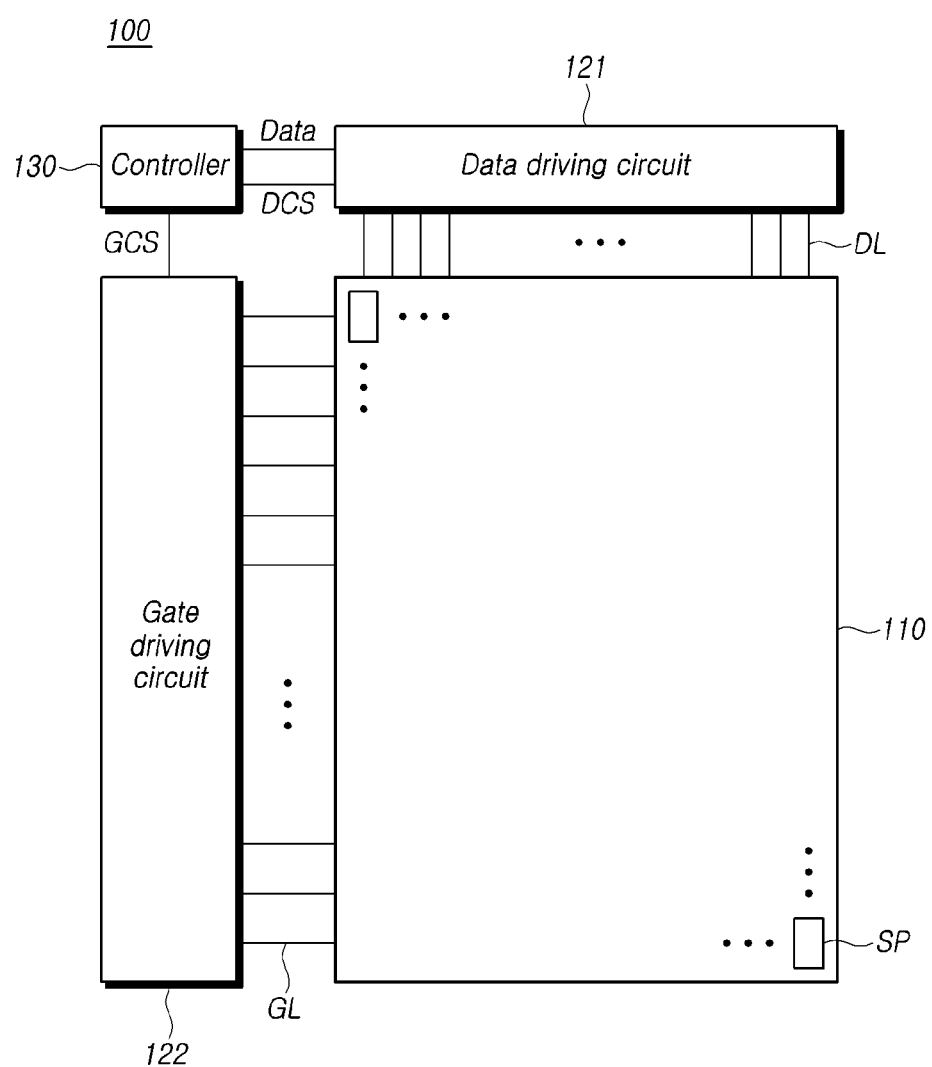

FIGS. 1 and 2 are block diagrams illustrating a schematic configuration of a stretchable display device according to aspects of the present disclosure.

Referring to FIG. 1, a display device according to aspects of the present disclosure 100 may include a display panel 110 including a substrate SUB, and a plurality of subpixels SP and a plurality of lines SL on the substrate SUB, a driving circuit 120 for driving the display panel 110, and a controller 130 controlling the driving circuit 120.

The display device 100 is a stretchable display device. In order for the display device 100 to have stretch, elasticity, or flexibility (hereinafter, referred to as "stretch" for convenience of description), it is necessary for the display panel 110 that is a main component of the display device 100 to have stretch.

The substrate SUB may be formed of a stretchable material to increase the stretch of the display panel 110. For example, a material of the stretchable substrate SUB may include at least one of urethane acrylate, epoxy acrylate, polydimethylsiloxane (PDMS), and thermoplastic poly urethane (TPU) etc.

Meanwhile, to increase the stretch of the display panel 110, all components (e.g., an electrode, a line, a circuit element, or the like) disposed over the substrate SUB may have stretch, or in some instances, at least one component, e.g., the line, may have stretch.

For example, to increase the stretch of the display panel 110, the plurality of lines SL disposed long over the substrate SUB may be needed to be formed of a stretchable material.

A material of stretchable lines SL may be formed of a mixture of a rubber material and either a silver nanoparticle (AgNP) or a silver nanowire.

A degree (or a level) of the stretch of the display panel 110 may be defined depending on a ratio of stretchable components disposed over the substrate SUB to all components (e.g., an electrode, a line, a circuit element, or the like) disposed over the substrate SUB.

In the present disclosure, the stretch of the display panel 110 or the stretchable display panel 110 means that a length, or a width etc. of the display panel 110 can be increased or decreased, and may include that the display panel is bendable, flexible, rollable, foldable, or the like.

Meanwhile, the display panel 110 may be stretchable in all locations or areas thereof. In some instances, the display panel 110 may be stretchable in a specific location or area thereof. In addition, the display panel 110 may be stretchable in all directions or in a specific direction. A degree (or a level) of the stretch of the display panel 110 may be equal in all locations, areas or directions thereof. The aspects of the present disclosure are not limited thereto. The degree (or the level) of the stretch in a specific location, area or direction of the display panel 110 may be different from other locations, areas or directions thereof.

Meanwhile, with reference to FIG. 1, the plurality of lines SL disposed in the display panel 110 may include a row line RSL disposed in the row direction and a column line CSL disposed in the column direction.

In the configuration shown in FIG. 2, the row line RSL may be a gate line GL and the column line CSL may be a data line DL. The aspects of the present disclosure are not limited thereto. According to designs of the panel the row line RSL may be a data line DL and the column line CSL may be a gate line GL. Hereinafter, it is considered that, for convenience of description, the gate line GL is the row line RSL and the data line DL is the column line CSL.

Thus, a plurality of data lines DL and a plurality of gate lines GL may be arranged to intersect each other in the panel and a plurality of subpixel SP may be defined by the plurality of data lines DL and the plurality of gate lines GL.

The driving circuit 120 may include a data driving circuit 121 driving the plurality of data lines DL and a gate driving circuit 122 driving the plurality of gate lines.

In order to control the data driving circuit 121 and the gate driving circuit 122, the controller 130 may provide various control signals DCS and GCS to the data driving circuit 121 and the gate driving circuit 122.

For example, to control the gate driving circuit 122, the controller 140 may output a gate driving timing control signal GCS including a gate start pulse GSP, a gate shift clock GSC, a gate output enable signal GOE, or the like.

Here, the gate start pulse GSP is used for controlling a gate driving operation start timing. The gate shift clock GSC is a clock signal input to the gate driving circuit 122, and is used for controlling a shift timing of a scan signal (a gate pulse). The gate output enable signal GOE is used for indicating driving timing information of the gate driving circuit 122.

For example, to control the data driving circuit 121, the controller 140 may output a data driving timing control signal DCS including a source start pulse SSP, a source sampling clock SSC, a source output enable signal SOE, or the like.

Here, the source start pulse SSP is used for controlling a data sampling start timing of the data driving circuit 121. The source sampling clock SSC is a clock signal for controlling a sampling timing of data in the data driving circuit 121. The source output enable signal SOE is used for controlling an output timing of the data driving circuit 121.

The controller 130 starts scanning operation according to timing processed in each frame, converts image data input from other devices or image providing sources to a data signal form used in the data driving circuit 121 and then outputs image data DATA resulted from the converting, and controls the driving of at least one data line at a pre-configured time by matching the scanning operation.

According to controlling of the controller 130, the gate driving circuit 122 sequentially provides a scan signal, such as an on-voltage or an off-voltage, to the plurality of gate lines GL.

When a specific gate line is asserted by a scan signal from the gate driving circuit 122, the data driving circuit 121 converts image data DATA received from the controller 130 into analog data voltages and provides the resulted analog data voltages to the plurality of data lines DL.

The controller 130 may be a timing controller used in the typical display technology or a control apparatus/device capable of additionally performing other control functionalities in addition to the typical function of the timing controller. The controller 130 may be implemented by a micro control unit MCU, a field programmable gate array FPGA device, a processor, or the like.

The controller 130 may be implemented as a separate unit from the data driving circuit 121, or implemented as an integrated circuit along with the data driving circuit 121.

The data driving circuit 121 drives the plurality of data lines DL by providing data voltages to the plurality of data lines DL. Herein, the data driving circuit 121 may also be referred to as a "source driver."

The data driving circuit 121 may include one or more source driver integrated circuits SDIC. Each source driver integrated circuit SDIC may include a shift register, a latch circuit, a digital to-analog converter DAC, and an output buffer, or the like. In some instances, each source driver integrated circuit SDIC may further include one or more analog to digital converters ADC.

The data driving circuit 121 may be electrically connected to the display panel 110 by being implemented in a tape automated bonding (TAB) type or a chip on glass (COG) type, or a chip on film (COF) type.

The gate driving circuit 122 sequentially drives the plurality of gate lines GL by sequentially providing scan signals to the plurality of gate lines GL. Herein, the gate driving circuit 122 may also be referred to as a "scan driver."

The data driving circuit 122 may include one or more gate driver integrated circuits GDIC. Each gate driver integrated circuit GDIC may include a shift register, a level shifter, and the like.

The gate driving circuit 122 may be electrically connected to the display panel 110 by being implemented in a tape automated bonding (TAB) type or a chip on glass (COG) type, or a chip on film (COF) type. In some instances, the gate driving circuit 122 may be mounted on the display panel 110 by being implemented in a gate in panel (GIP) type As shown in FIG. 2, the data driving circuit 121 may be located on, but not limited to, only one side (e.g., an upper side or a lower side) of the panel 110, or in some instances, be located on, but not limited to, two sides (e.g., the upper side and the lower side) of the display panel 110 according to driving schemes, panel design schemes, or the like.

Figure 3:
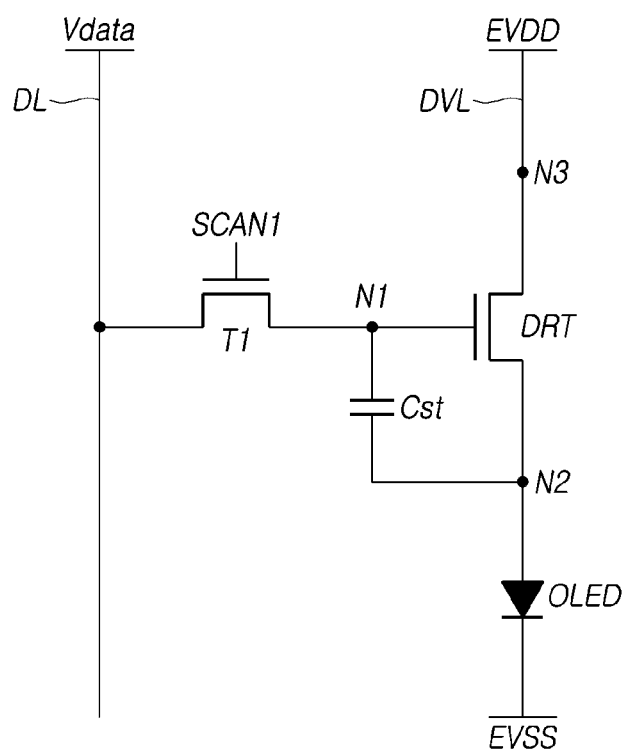
FIG. 3 is a circuit diagram illustrating a subpixel in the stretchable display device according to aspects of the present disclosure.

As shown in FIG. 3, the gate driving circuit 122 may be located on, but not limited to, only one side (e.g., a left side or a right side) of the panel 110, or in some instances, be located on, but not limited to, two sides (e.g., the left side and the right side) of the display panel 110 according to driving schemes, panel design schemes, or the like.

Meanwhile, the stretchable display device 100 according to aspects of the present disclosure may mean or include a bendable display device, a flexible display device, a rollable display device, or a foldable display device. The stretchable display panel 110 according to aspects of the present disclosure may mean or include a bendable display device, a flexible display device, a rollable display device, or a foldable display device.

The stretchable display device 100 according to aspects of the present disclosure may be various types of display device, such as, a liquid crystal display device, an organic light emitting display device, or the like. The stretchable display panel 110 may be various types of display panel, such as, a liquid crystal display panel, an organic light emitting display panel, or the like.

Each subpixel SP disposed in the display panel 110 may be configure with one or more electronic elements, such as, an organic light emitting diode, a driving transistor for driving the organic light emitting diode, a switching transistor electrically connected between a first node of the driving transistor and a corresponding data line, a storage capacitor electrically connected between the first node and a second node of the driving transistor DRT, or the like. Types of electronic elements and the number of the electronic elements may be variously determined depending on types of the panel (e.g., a liquid crystal display LCD, an organic light emitting diode OLED, etc.), implemented functions, design schemes/features, or the like.

Figure 4:
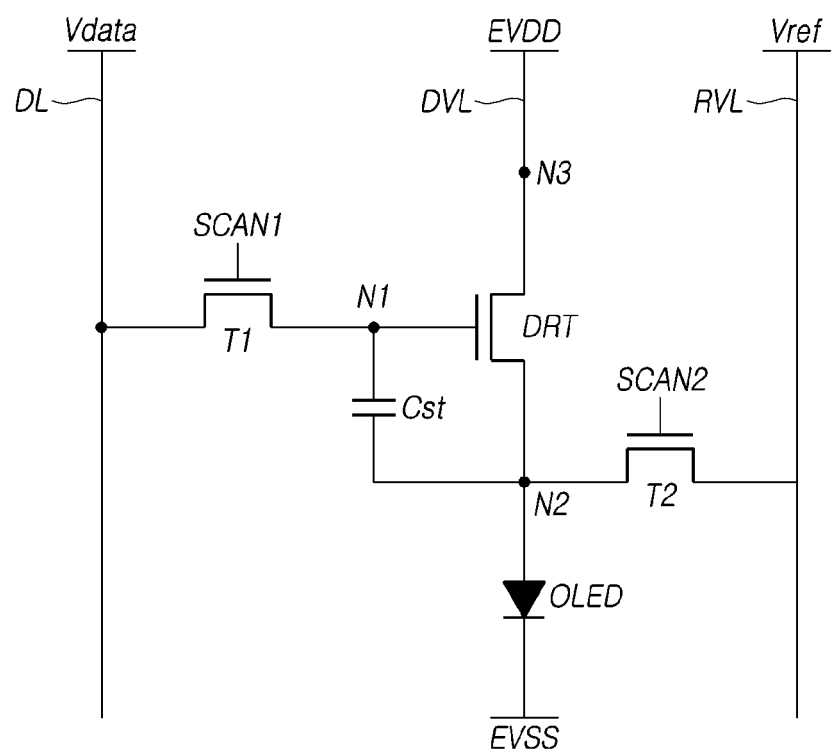
FIG. 4 is a circuit diagram illustrating another subpixel in the stretchable display device according to aspects of the present disclosure.

FIGS. 3 and 4 show example structures of subpixels disposed in the display panel 110, which is an OLED panel.

Referring to FIG. 3, each of the plurality of subpixels may include, but not limited to, an organic light emitting diode OLED, a driving transistor DRT for driving the organic light emitting diode OLED, a first transistor T1 for transferring a data voltage Vdata to a first node N1 that is the gate node of the driving transistor DRT, a storage capacitor Cst for maintaining a voltage for a time interval of one frame, or the like.

The organic light emitting diode OLED may include a first electrode, an organic light emitting layer and a second electrode etc. Here, the first electrode may be an anode electrode. The second electrode may be a cathode electrode to which a cathode voltage EVSS is applied. In some instances, the first electrode may be a cathode electrode, and the second electrode may be an anode electrode.

The driving transistor DRT may be electrically connected between the first electrode of the organic light emitting diode OLED and a driving voltage line DVL.

The first node N1 of the driving transistor DRT is the gate node, and may be electrically connected to a source node or a drain node of the first transistor T1. A data voltage Vdata may be applied to the first node N1 of the driving transistor DRT. A second node N2 of the driving transistor DRT may be a source node or a drain node, and electrically connected to the first electrode of the organic light emitting diode OLED. A third node N3 of the driving transistor DRT may be the drain node or the source node. A driving voltage line DVL may be electrically connected to the third node N3.

The first transistor T1 may be controlled by a scan signal SCAN1 supplied through a corresponding gate line GL, and be electrically connected between the gate node N1 of the driving transistor DRT and a corresponding data line DL.

The first transistor T1 may be turned on by the scan signal SCAN1, and transfer a data voltage Vdata provided from a corresponding data line DL to the first node N1 that is the gate node of the driving transistor DRT.

The storage capacitor Cst may be electrically connected between the first node N1 and the second node N2 of the driving transistor DRT.

The plurality of lines SL disposed in the display panel 110 may include at least one data line DL, at least one driving voltage line DVL, at least one gate line GL, etc. Here, at least one of at least one data line DL, at least one driving voltage line DVL or at least one gate line GL may be a stretchable line SL.

As shown in FIG. 3, each subpixel SP in the display panel 110 may have a 2T-1C structure in which 2 transistors (2T) and 1 capacitor (1C) are disposed.

However, aspects of the present disclosure are not limited thereto. In some aspects, the subpixel SP in the display panel 110 may further include at least one transistor and/or at least one capacitor.

For example, as shown in FIG. 4, each subpixel SP may be controlled by a second scan signal SCAN2, and may further include a second transistor T2 electrically connected between the second node N2 of the driving transistor DRT and a reference voltage line RVL.

Referring to FIG. 4, each of the first scan SCAN1 and the second scan signal SCAN2 may be transferred by an identical gate line GL or a different gate line GL from the other.

Figure 5:
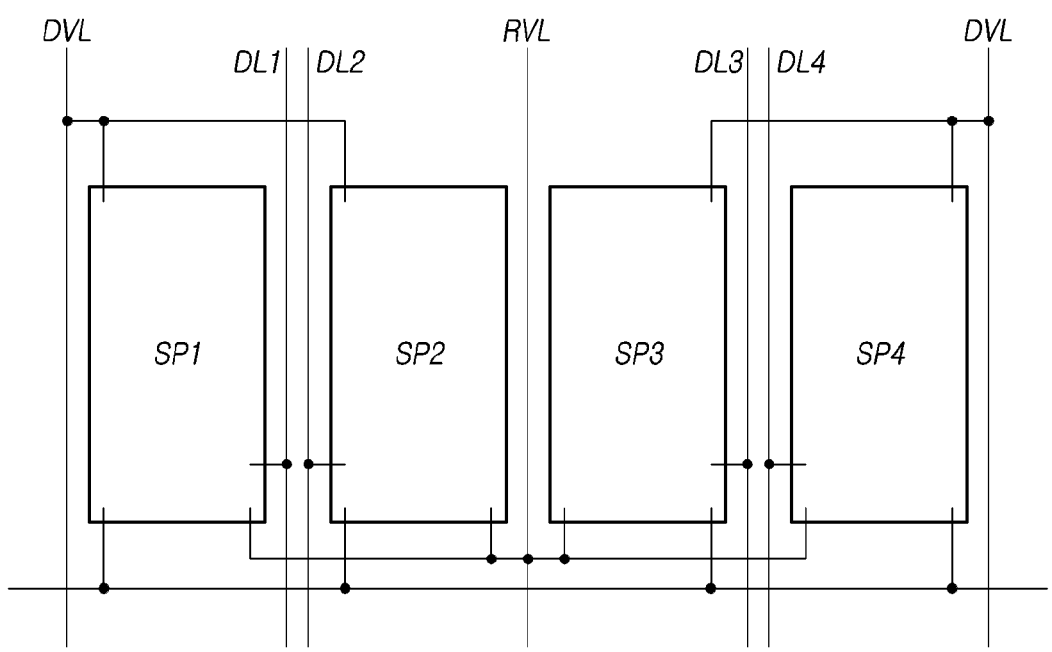
FIG. 5 illustrates wiring arrangement in the stretchable display device according to aspects of the present disclosure.

FIG. 5 illustrates wiring arrangement in the stretchable display device according to aspects of the present disclosure. In some aspects, for convenience of description and ease of understanding, it can be considered that each subpixel SP have a structure shown in FIG. 4, and the first scan signal SCAN1 and the second scan signal SCAN2 are an identical scan signal delivered by an identical gate line GL. Further, discussions are conducted on a wiring arrangement structure in an area in which four subpixels SP1, SP2, SP3, and SP4 are disposed.

Referring to FIG. 5, the gate line GL is the row line RSL and the data line DL is the column line CSL.

The driving voltage line DVL is a line for delivering a driving voltage EVDD to the third node N3 of the driving transistor DRT, and may be a column line CSL disposed in parallel to data lines DL1, DL2, DL3, and DL4.

The driving voltage line DVL may be disposed per one subpixel column. However, aspects of the present disclosure are not limited thereto. As shown in FIG. 5, one driving voltage line DVL may be disposed per two subpixel columns or four subpixel columns. That is, one driving voltage line DVL may deliver a driving voltage EVDD to two subpixels SP1 and SP2 together.

The reference voltage line RVL is a line for delivering a reference voltage Vref to the second node N2 of the driving transistor DRT, and may be a column line CSL disposed in parallel to data lines DL1, DL2, DL3, and DL4.

The reference voltage line RVL may be disposed per one subpixel column. However, aspects of the present disclosure are not limited thereto. As shown in FIG. 5, one reference voltage line RVL may be disposed per two subpixel rows or four subpixel rows. That is, one reference voltage line RVL may deliver a reference voltage Vref to two subpixels SP1 and SP4 together.

With reference to the FIG. 5, in case the display panel 110 is stretched (expanded) in the column direction, column lines CSL including the data lines DL1, DL2, DL3, and DL4, driving voltage line DVL, reference voltage line RVL, etc. may be stretched (expanded).

In case the display panel 110 is stretched (expanded) in the row direction, row lines CSL including gate lines GL, etc. may be stretched (expanded).

In case the display panel 110 is stretched (expanded) in the row and column directions, both the column lines CSL and the row lines CSL may be stretched (expanded).

Figure 6:
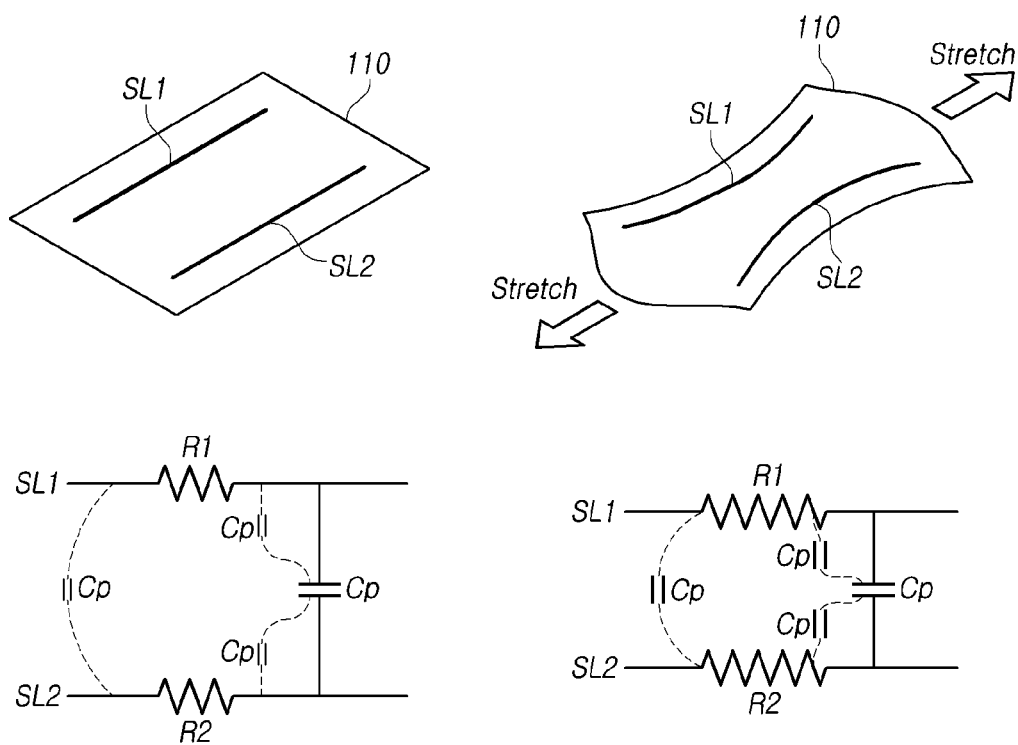
FIGS. 6 and 7 illustrate a variation in time constant of a line as the stretchable display device is stretched, according to aspects of the present disclosure.
Figure 7:
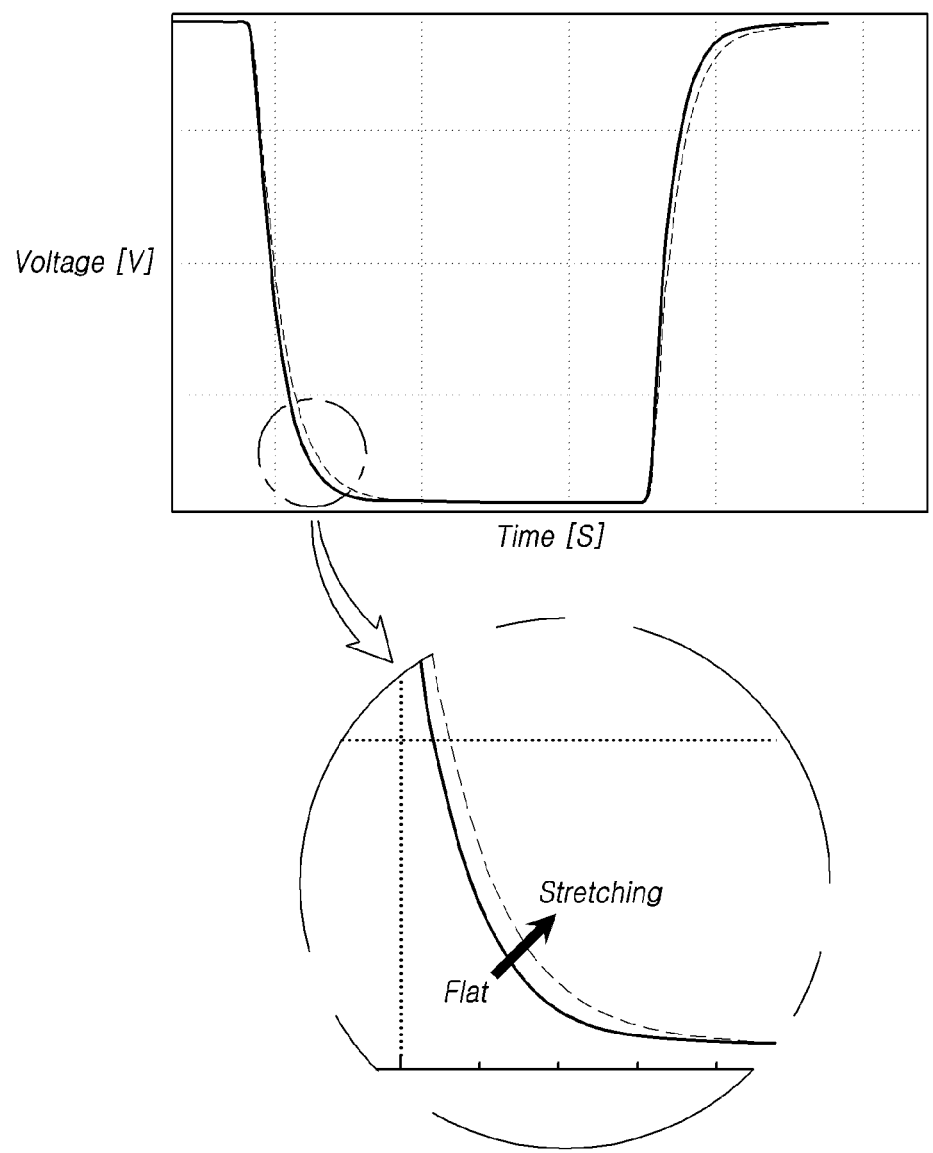

FIGS. 6 and 7 illustrate a variation in a time constant of a line as the stretchable display device is stretched, according to aspects of the present disclosure.

Referring to FIG. 6, in case the display panel 110 is stretched, lines SL1 and SL2 disposed in the display panel 110 may be stretched.

In this case, when each of the lines SL1 and SL2 is stretched, the length of the lines becomes larger, and therefore resistance values R1 and R2 thereof can be larger. In addition, in case the display panel 110 is stretched, an interval between the lines SL1 and SL2 becomes smaller, and therefore a related parasitic capacitance Cp can be larger.

Accordingly, a time constant of each of the lines SL1 and SL2 can be larger.

In addition, in case the display panel 110 is stretched, the lines SL1 and SL2 can be stretched, and there may occur a difference in stretching between lines SL1 and SL2. Accordingly, there may occur a difference in time constant variance between the lines SL1 and SL2. That is, a signal delivering rate of each of the lines SL1 and SL2 may be different from another.

Here, the time constant of each of the lines SL1 and SL2 may be an index indicating how fast each of the lines SL1 and SL2 delivers an input signal. Such a time constant (t) may be referred to as resistive-capacitive delay (RC delay), where t=R*C.

As shown in FIG. 7, when the display panel 110 is stretched from a flat state, a time constant of the lines SL1 and SL2 can be larger, and therefore, it takes a longer time for a voltage input to one end of the lines SL1 and SL2 to reach a desirable level in the other end of the lines SL1 and SL2.

As described above, as the display panel 110 is stretched, when there occurs the stretch of the lines SL1 and SL2 or occurs a difference in stretching between lines SL1 and SL2, there may therefore occur a variance in time constant of the lines SL1 and SL2, or a difference in time constant between lines SL1 and SL2.

In this case, the lines SL1 and SL2 may not transmit a desired voltage with a target timing (desired timing) to various electrodes or circuit elements, or there may occur a deviation in signal delivering rate (signal transmission speed) between lines SL1 and SL2. As a result, driving by the signal transmission of the lines SL1 and SL2 cannot be normally performed. Eventually, the image quality may be deteriorated.

For example, in case signals with voltage waveforms as shown in FIG. 7 is scan signals SCAN1 and SCAN2 applied to a gate line GL, the first and second transistors T1 and T2 shown in FIG. 4 may not be turned on or turned off in a target timing. Thus, a corresponding subpixel SP may not emit light in a target timing, or may not provide required luminescence. Therefore, display quality of images may be degraded.

To address such an issue, in accordance with aspects of the present disclosure, in case the display device 100 is configured to be stretchable, even when the display panel 110 included in the display device is stretched and there may occur a variance in time constant of the lines SL1 and SL2, or a difference in time constant between lines SL1 and SL2, a driving method or a driving device are provided for compensating a variance in time constant of the lines SL1 and SL2 or a difference in time constant between lines SL1 and SL2, in order to maintain original display quality of images before the display panel 110 is stretched.

Hereinafter, the driving method for maintaining the original display quality even when the display panel 110 is stretched is discussed in detail.

Figure 8:
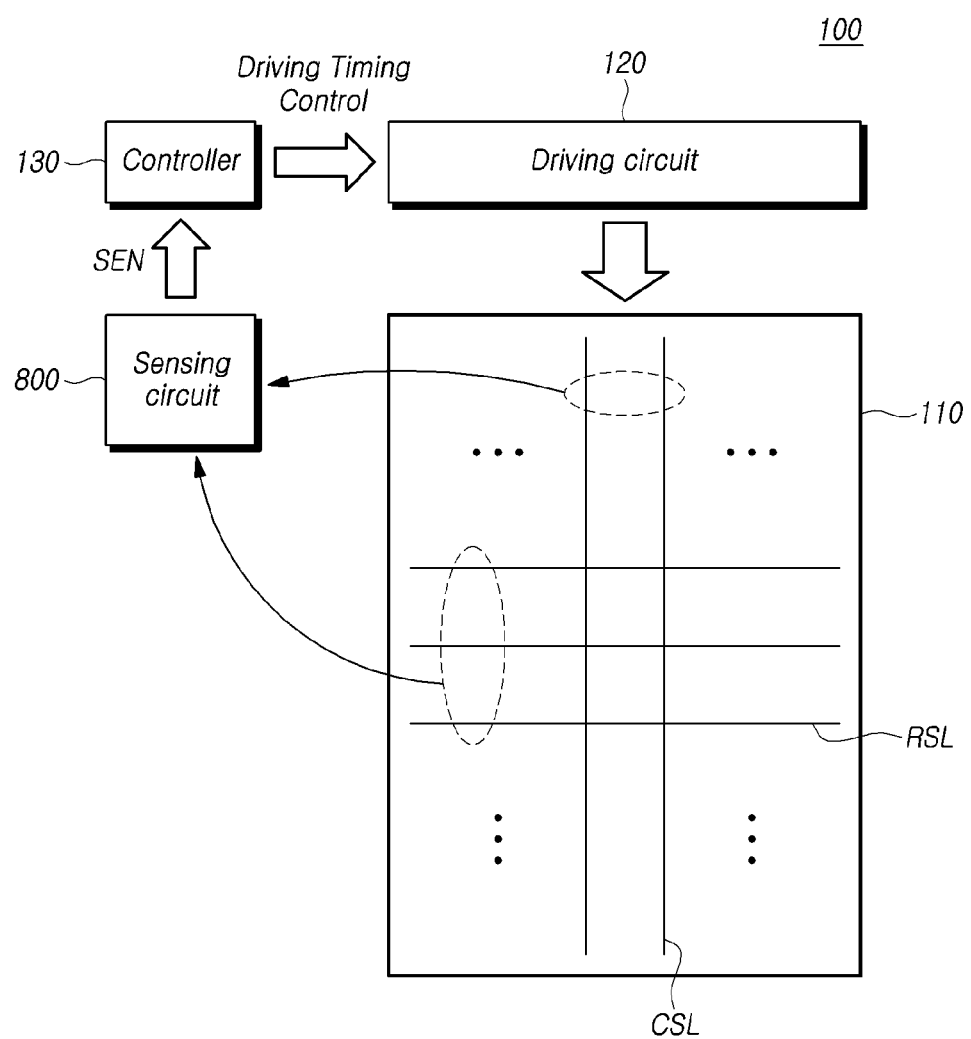
FIG. 8 illustrates a driving method for compensating a variation/difference in time constant of lines as the display panel is stretched, in the stretchable display device according to aspects of the present disclosure.

FIG. 8 illustrates the driving method for compensating a variation/difference in time constant of lines as the display panel is stretched, in the stretchable display device according to aspects of the present disclosure.

Referring to FIG. 8, the display device 100 according to aspects of the present disclosure may include a display panel 110 that includes a plurality of lines SL and that is stretchable, a driving circuit 120 outputting a signal to the plurality of lines SL, or the like.

Referring to FIG. 8, as the display panel 110 is stretched, in case a variation/difference in time constant of lines occurs, it is possible to provide the driving method for compensating the variance/difference in time constant of lines, and therefore it is possible to prevent degradation of display quality of images caused by the stretch of the display panel 110.

Here, as the display panel 110 is stretched, lines having a variation/difference in time constant caused by the stretching of the lines may be lines corresponding to a stretched direction or an increased length, and may be column lines CSL and/or row lines RSL.

Referring to FIG. 8, the stretchable display device 100 according to aspects of the present disclosure may further include a sensing circuit 800 sensing a variation/difference in time constant caused by the stretching of the display panel 110, and outputting a sensing result including a time constant related value SEN for all or at least one of the plurality of lines, to compensate a variation in time constant of lines caused by the stretching of display panel 110.

Here, the sensing circuit 800 may measure a voltage applied to or a current flowing in, all or at least one of the plurality of lines SL. The measured voltage or current may be a value corresponding to a resistance value and/or a capacitance value of corresponding lines SL.

For example, a time constant related value SEN included in a sensing result output from the sensing circuit 800 may be a measured voltage or current value, or a resistance value and/or a capacitance value, or a time constant itself.

Such a sensing circuit 800 may be made up of a single component, or include an analog to digital converter ADC, etc.

The controller 130 may control a timing for driving lines having a variation/difference in time constant based on a sensing result SEN output from the sensing circuit 800.

To this end, the controller 130 may change a control signal, such as, a data driving timing control signal DCS and/or a gate driving timing control signal GCS for supplying to the driving circuit 120 or adjust an output timing of the control signal.

Thus, after the display panel 110 has been stretched, the driving circuit 120 may output a signal in a timing other than a timing output when the display panel 110 is operated without the display panel 110 stretched.

As another method, after the display panel 110 has been stretched, the driving circuit 120 may change characteristics of a signal generated when the display panel 110 is operated without the display panel 110 stretched, and then output the signal with the changed characteristics. Here, for example, the characteristics of the signal may be a magnitude e.g., a voltage, of the signal, etc. In some instances, the characteristics of the signal may be whether an over-drive is required, a magnitude of an over-drive voltage, or the like.

In other words, when the display panel 110 is stretched, compared with a flat state before the display panel 110 is stretched, a timing of a signal output to at least one of the plurality of lines SL may be changed or a signal with changed characteristics may be output to at least one of the plurality of lines SL.

Here, a line to which a signal is applied in a changed timing or a signal with changed characteristics is applied may be a line with a changed time constant caused by the stretching of the line along with the stretching of the display panel 110.

As described above, the sensing circuit 800 may sense a variation/difference in time constant of the lines caused by the stretching of the display panel 110, and output a sensing result including a time constant related value SEN for all or at least one of the plurality of lines.

When the display panel 110 is stretched, the controller 130 may control a timing for driving all or at least one of the plurality of lines or enable characteristics of a signal supplied to all or at least one of the plurality of lines SL to be changed, based on the time constant related value SEN obtained by sensing all or at least one of the plurality of lines SL.

Here, for example, the characteristics of the signal may be a magnitude e.g., a voltage, of the signal, etc. In some instances, the characteristics of the signal may be whether an over-drive is required, a magnitude of an over-drive voltage, or the like.

The sensing circuit 800 may sense all or at least one of the plurality of lines SL on a one-by-one basis according to an individual sensing scheme, or sense on a group basis by grouping all or at least two of the plurality of lines SL into one according to a group sensing scheme in order to improve sensing efficiency.

In case of the individual sensing scheme, a time constant related value for all or at least one of the plurality of lines may include, e.g., at least one of a resistance value, a capacitance value, and a time constant value of each of all or at least one of the plurality of lines.

In case of the group sensing scheme, a time constant related value for all or at least one of the plurality of lines may include at least one of a resistance value, a capacitance value, and a time constant value of each group for all or at least one of the plurality of lines.

Meanwhile, the controller 130 may recognize whether the display panel 110 is stretched, or a stretched location at which the display panel 110 is stretched, using a sensing result from the sensing circuit 800.

That is, the controller 130 may determine whether the display panel 110 is stretched, or determine a location where the display panel has been stretched, based on the time constant related value SEN sensed for all or at least one of the plurality of lines SL.

Alternatively, in case a stretch event signal occurs which is generated by at least one other stretch sensing unit in the display device 100 after the stretch sensing unit has sensed the stretching of the display panel 110 or a stretched location, the sensing circuit 800 may initiate a sensing operation to find out a line SL having a variation/difference in time constant in a state where the display panel 110 is stretched For example, the display panel 110 may sense whether the display panel 110 is stretched based on an environment setting value or an input value by a user, or may sense whether the display panel 110 is stretched or a stretched location using variances in capacitance values of one electrode or between electrodes, for sensing the stretching the display panel 110 in the display panel 110.

In this case, when the stretch event signal for indicating the stretching of the display panel 110 has occurred by the stretch sensing unit, the sensing circuit 800 may sense a time constant related value of all or at least one of the plurality of lines SL.

Meanwhile, for enabling the sensing circuit 800 to sense a time constant related value SEN for all or at least one of the plurality of lines SL, in case of the individual sensing scheme, at least one a resistance and a capacitor may be electrically connected to each of the plurality of lines SL, or in the group sensing scheme, at least one a resistance and a capacitor may be electrically connected to each group of the plurality of lines SL. Here, the resistance and the capacitor etc. may be located in an edge area of the display panel 110, or located on one or more other circuit components (e.g., a printed circuit).

Meanwhile, referring to FIG. 8, all or at least one of the plurality of lines SL to be sensed may be disposed in the row direction, and include at least two row lines RSL of an identical type.

For example, the at least two row lines RSL of the identical type may include at least two gate lines GL. For another example of wiring arrangement, the at least two row lines RSL of the identical type may include at least two data lines DL. For further another example, the at least two row lines RSL of the identical type may include at least two driving voltage lines DVL. For still another example, the at least two row lines RSL of the identical type may include at least two reference voltage lines RVL.

Referring to FIG. 8, all or at least one of the plurality of lines SL to be sensed may include at least two row lines RSL of different types from each other, disposed in the row direction.

For example, the at least two row lines RSL of the different types may include a gate line GL and a signal line of a different type from the gate line GL. For another example of wiring arrangement, the at least two row lines RSL of the different types may include a data line DL and a driving voltage line DVL. For further another example, the at least two row lines RSL of the different types may include a data line DL and a reference voltage line RVL. For still another example, the at least two row lines RSL of the different types may include a driving voltage line DVL and a reference voltage line RVL.

Referring to FIG. 8, all or at least one of the plurality of lines SL to be sensed may be disposed in the column direction, and include at least two column lines CSL of an identical type.

For example, the at least two column lines CSL of the identical type may include at least two data lines DL. For another example, the at least two column lines CSL of the identical type may include at least two driving voltage lines DVL. For further another example, the at least two column lines CSL of the identical type may include at least two reference voltage lines RVL. For still another example, the at least two column lines RSL of the identical type may include at least two gate lines GL.

Referring to FIG. 8, all or at least one of the plurality of lines SL to be sensed may include at least two column lines CSL of different types from each other, disposed in the column direction.

For example, the at least two column lines CSL of the different types may include a data line DL and a driving voltage line DVL. For another example, the at least two column lines CSL of the different types may include a data line DL and a reference voltage line RVL. For further another example, the at least two column lines CSL of the different types may include a driving voltage line DVL and a reference voltage line RVL. For still another example, the at least two column lines CSL of the different types may include a gate line GL and a signal line of a different type from the gate line GL.

Meanwhile, the sensing circuit 800 may be located in the driving circuit 120, or on the printed circuit located outside of the driving circuit 120.

The printed circuit may be electrically connected to the driving circuit 120 or the display panel 110. Such printed circuit may be, not limited to, a printed circuit board (PCB), a flexible printed circuit (FPC), etc.

Figure 9:
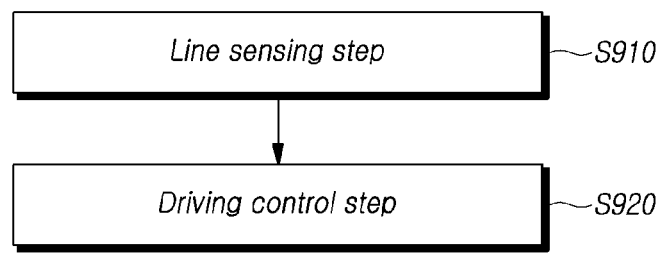
FIG. 9 is a flow chart showing a driving method for compensating a variation in time constant of lines as the display panel is stretched, in the stretchable display device according to aspects of the present disclosure.

FIG. 9 is a flow chart illustrating a driving method for compensating a variation/difference in time constant of lines as the display panel is stretched, in the stretchable display device according to aspects of the present disclosure.

The stretchable display device 100 according to aspects of the present disclosure may include a display panel 110 on which a plurality of lines SL and a plurality of subpixels SP are disposed, a driving circuit 120 for driving the plurality of lines SL, or the like.

Referring to FIG. 9, the method of driving the stretchable display device 100 may include sensing S910 one or more lines (referred to as a line sensing step), controlling S920 the driving of the lines (referred to as a driving control step).

In the line sensing step S910, the sensing circuit 800 may sense a time constant related value for all or at least one of the plurality of lines SL.

In the driving control step S920, the controller 130 may control a driving operation of the driving circuit 120 using the time constant related value SEN that is a sensing result performed in the line sensing step S910. Here, the driving circuit 120 may include at least one of the data driving circuit 121 and the gate driving circuit 122. The driving circuit 120 may be a power supply circuit other than the data driving circuit 121 and the gate driving circuit 122.

In the driving control step S920, when the display panel 110 is stretched, the controller 130 may control a timing for driving all or at least one of the plurality of lines or enable characteristics of a signal supplied to all or at least one of the plurality of lines SL to be changed, based on the time constant related value SEN obtained by sensing all or at least one of the plurality of lines SL. Here, for example, the characteristics of the signal may be a magnitude e.g., a voltage, of the signal, etc. In some instances, the characteristics of the signal may be whether an over-drive is required, a magnitude of an over-drive voltage, or the like.

Thus, when the display panel 110 is stretched, compared with a flat state before the display panel 110 is stretched, a timing of a signal output to at least one of the plurality of lines SL may be changed or the signal with changed characteristics, e.g., a magnitude of the signal, a magnitude of an over-drive voltage, etc. may be output to at least one of the plurality of lines SL.

Figure 10:
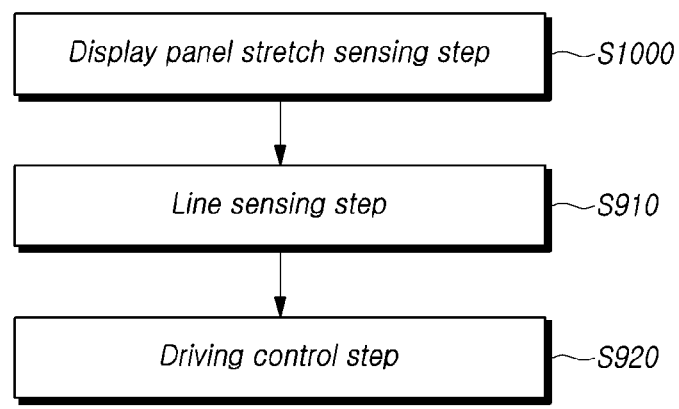
FIG. 10 is a flow chart showing a driving method for compensating a variation in time constant obtained by sensing lines after the stretching of the display panel has been sensed, in the stretchable display device according to aspects of the present disclosure.

FIG. 10 is a flow chart showing a driving method for compensating a variation in time constant based on time constant values obtained by sensing lines after the stretching of the display panel has been sensed, in the stretchable display device according to aspects of the present disclosure.

Referring to FIG. 10, the method of driving the stretchable display device 100 according to aspects of the present disclosure may further include a display panel stretch sensing step S1000 for generating a stretch event signal by sensing whether the display panel 110 is stretched or a stretching location based on an input signal prior to the line sensing step S910.

Here, the input signal may be an environment setting value or an input value by a user, etc., or may be a sensed signal for an amount of variances in capacitance between electrodes for sensing the stretching the display panel 110 in the display panel 110.

The line sensing step S910 may be initiated according to the display panel stretch sensing step S1000.

In the line sensing step S910, the sensing circuit 800 may selectively sense one or more lines SL corresponding to a stretched location sensed in the display panel stretch sensing step S1000. Through this, it is possible to efficiently and rapidly sense the lines.

Figure 11:
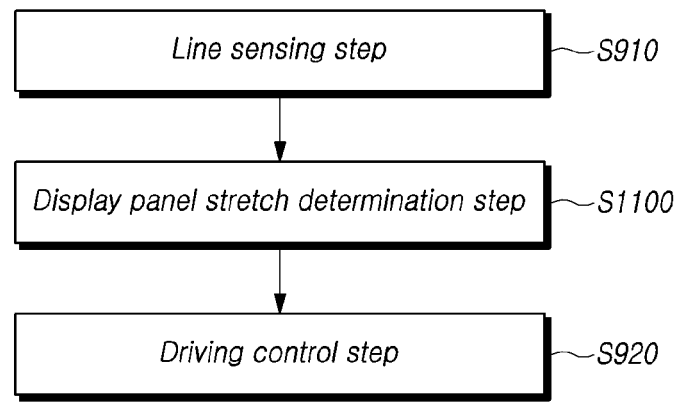
FIG. 11 is a flow chart showing a driving method for compensating a variation in time constant by recognizing that the display panel has been stretched based on a time constant value obtained by sensing a line in the stretchable display device according to aspects of the present disclosure.

FIG. 11 is a flow chart showing a driving method of sensing a time constant of the lines SL, recognizing that the display panel 110 is stretched, and compensating a variation in time constant of the lines, in the stretchable display device according to aspects of the present disclosure.

Referring to FIG. 11, the driving method of the display device 100 according to aspects of the present disclosure may further include a display panel stretch determination step S1100 for sensing determining whether the display panel 110 is stretched or a stretching location of the display panel 110 based on a time constant related value obtained by sensing all or at least one of the plurality of lines after the line sensing step S910, As described above, discussions have been conducted on the driving method for compensating the variance/difference in time constant of lines in case a variation/difference in time constant of the lines occurs as the display panel 110 is stretched. Hereinafter, an exemplary driving method will be discussed in detail.

Figure 12:
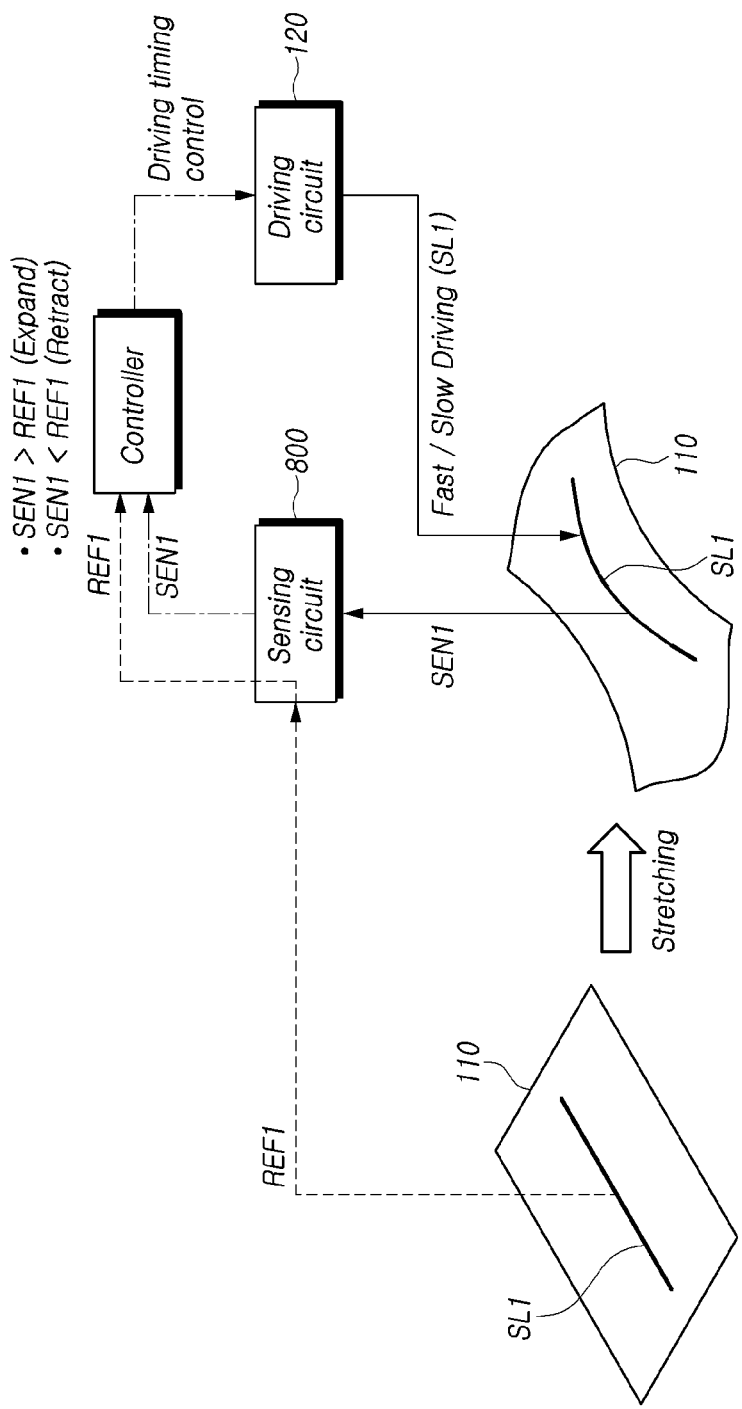
FIG. 12 illustrates a method of controlling a driving timing of a line through the sensing of a time constant of a first line in the stretchable display device according to aspects of the present disclosure.

FIG. 12 illustrates a method of controlling a driving timing of a line through the sensing of a time constant of a first line in the stretchable display device according to aspects of the present disclosure.

With reference to FIG. 12, lines SL to be sensed by the sensing circuit 800 may be all or at least one of the plurality of lines SL disposed in the display panel 110.

In a flat state in which the display panel 110 is not stretched, a time constant related value for the plurality of lines SL disposed in the display panel 110 may be stored in advance in a memory (not shown) as a reference time constant value.

To this end, in the flat state, the sensing circuit 800 may sense a time constant related value for the plurality of lines SL disposed in the display panel 110, and then the sensing circuit 800 and the controller 130 may store the time constant related value obtained by sensing the plurality of lines SL as the reference time constant value in the memory.

The sensing circuit 800 and the controller 130 may recognize whether at least one line has been stretched or how much the at least one line has been stretched, or may recognize an amount of variances in time constant of lines SL, using the pre-stored reference time constant value for the plurality of lines SL.

With reference to FIG. 12, all or at least one of the plurality of lines SL disposed in the display panel 110 may include a first line SL1 that is stretched together when the display panel 110 is stretched.

The first line SL1 shown in FIG. 12 may be one line SL or a line group including at least two lines that are electrically short-circuited.

The sensing circuit 800 may output a first time constant related value SEN1 obtained by sensing the first line SL1.

The controller 130 may compare the first time constant related value SEN1 obtained by sensing the first line SL1 with a first reference time constant value REF1 of the first line SL1 which is pre-stored in the memory. Depending on a result of the comparing, the controller 130 may control a driving timing for the first line SL1 or enable characteristics (e.g., a magnitude of a signal, whether an over-drive is required, a magnitude of an over-drive voltage, etc.) of a signal supplied to the first line SL1 to be changed.

When the sensed first time constant related value SEN1 is larger than the first reference time constant value REF1, that is, as SEN1<REF1, the controller 130 may determine that the first line SL1 has been longer, in other words, a resistance of the first line SL1 has increased, and therefore, a time constant of the first line SL1 has been larger than a reference time constant (a time constant in the flat state), and to compensate the increased time constant, may output a control signal (e.g., DCS, GCS, or other control signals) for enabling the driving circuit 120 to drive the first line SL1 at an earlier timing than a reference driving timing (a driving timing in the flat state).

When the sensed first time constant related value SEN1 is larger than the first reference time constant value REF1, that is, as SEN1<REF1, the controller 130 may determine that the first line SL1 has been longer, in other words, the resistance of the first line SL1 has increased, and therefore, the time constant of the first line SL1 has been larger than the reference time constant (the time constant in the flat state), and to compensate the increased time constant, may control ☐) the driving circuit 120 to increase a magnitude of a signal to be supplied to the first line SL1, ☐) the signal to be supplied to the first line SL1 by the driving circuit 120 to be over-driven, or ☐) the driving circuit 120 to increase an over-drive voltage of the signal to be supplied to the first line SL1.

When the sensed first time constant related value SEN1 is smaller than the first reference time constant value REF1, that is, as SEN1<REF1, the controller 130 may determine that the first line SL1 has been shorter, in other words, a resistance of the first line SL1 has decreased, and therefore, a time constant of the first line SL1 has been smaller than a reference time constant (a time constant in the flat state), and to compensate the increased time constant, may output a control signal (e.g., DCS, GCS, or other control signals) for enabling the driving circuit 120 to drive the first line SL1 at a later timing than a reference driving timing (a driving timing in the flat state).

When the sensed first time constant related value SEN1 is smaller than the first reference time constant value REF1, that is, as SEN1<REF1, the controller 130 may determine that the first line SL1 has been shorter, in other words, the resistance of the first line SL1 has decreased, and therefore, the time constant of the first line SL1 has been smaller than the reference time constant (the time constant in the flat state), and to compensate the increased time constant, may control ☐) the driving circuit 120 to decrease a magnitude of a signal to be supplied to the first line SL1, ☐) the signal to be supplied to the first line SL1 by the driving circuit 120 not to be over-driven, or ☐) the driving circuit 120 to decrease an over-drive voltage of the signal to be supplied to the first line SL1.

Figure 13:
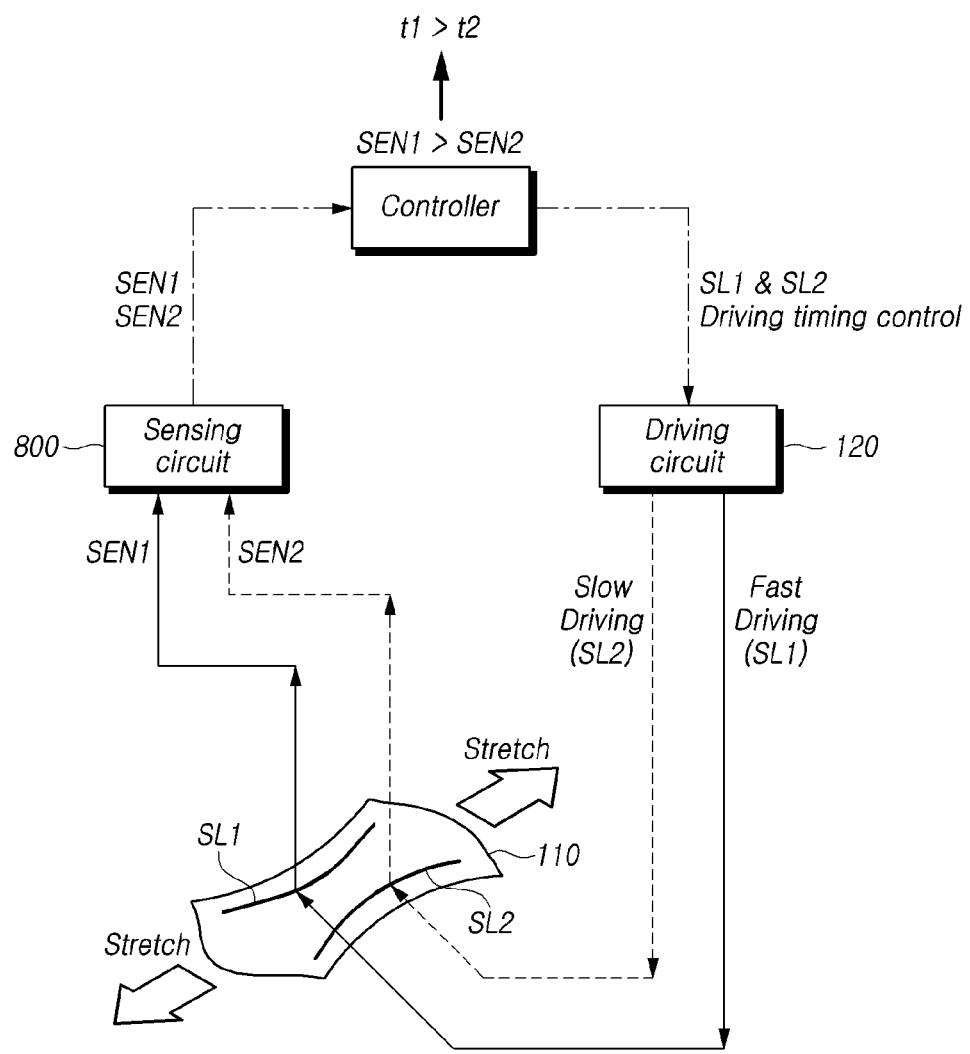
FIG. 13 illustrates a method of controlling a driving timing each of a first line and a second line by comparing time constants of the first line and the second line in the stretchable display device according to aspects of the present disclosure.
Figure 14:
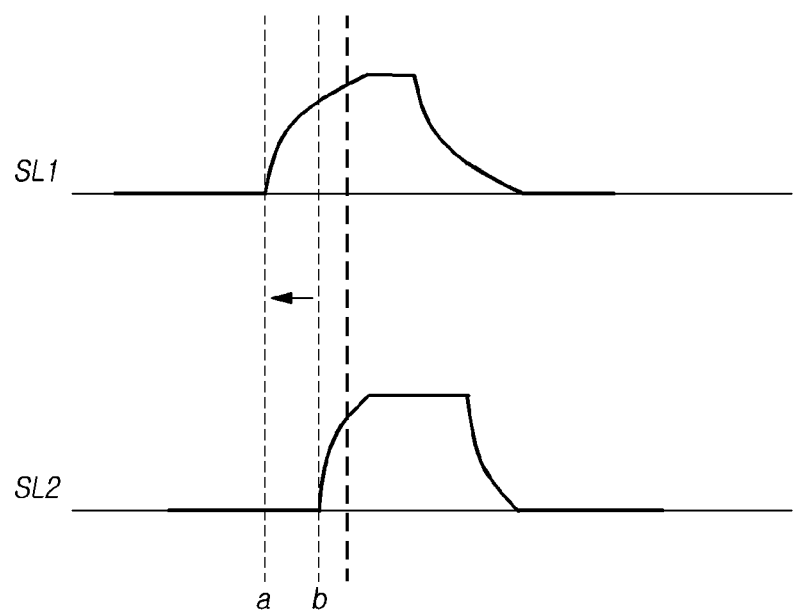
FIG. 14 illustrates conceptually a signal applied to the first line and a signal applied to the second line according to the control of the driving timing shown in FIG. 13.

FIG. 13 shows a method of controlling a driving timing of each of a first line and a second line by comparing respective time constants of the first line and the second line in the stretchable display device according to aspects of the present disclosure. FIG. 14 shows conceptually a signal applied to the first line and a signal applied to the second line according to the control of the driving timing shown in FIG. 13.

With reference to FIG. 13, all or at least one of the plurality of lines SL disposed in the display panel 110 may include the first line SL1 and the second line SL2 that are stretched together when the display panel 110 is stretched.

The first line SL1 shown in FIG. 13 may be one line SL or a line group including at least two lines that are electrically short-circuited. The second line SL2 may be one line SL or a line group including at least two lines SL that are electrically short-circuited.

For convenience of description, it can be considered that a time constant of the first line SL1 and a time constant of the second line SL2 are identical before the display panel 110 is stretched, and the time constant of the first line SL1 is larger than the time constant of the second line SL2 in a state where the display panel 110 is stretched.

The sensing circuit 800 may output a first time constant related value SEN1 obtained by sensing the first line SL1 and a second time constant related value SEN2 obtained by sensing the second line SL2.

When the first time constant related value SEN1 obtained by sensing the first line SL1 is larger than the second time constant related value SEN2 obtained by sensing the second line SL2, the controller 130 determines that a time constant t1 of the first line SL1 is larger than a time constant t2 of the second line SL2, that is, as t1>t2, in a state where the display panel 110 is stretched.

Thus, the controller 130 may output a control signal (e.g., DCS, GCS, or other control signals) for enabling the driving circuit 120 to drive the first line SL1 at an earlier timing than the second line SL2.

Thus, the driving circuit 120 can supply a corresponding signal to the first line SL1 at an earlier timing than the second line SL2.

As a result, the first line SL1 and the second line SL2 are driven at an the same time substantially. That is, even when there is a difference in time constant between the first line SL1 and the second line SL2, the first line SL1 and the second line SL2 are supplied with a voltage corresponding to a certain ratio to a required voltage, such as a voltage when the display panel is operated without being stretched or in the flat state.

FIG. 14 shows that a time constant t1 of a signal applied to the first line SL1 is larger than a time constant t2 of a signal applied to the second line SL2.

According to driving methods using aspects described above, the driving circuit 120 outputs a signal to the second line SL2 at B time. On the other hand, the driving circuit 120 may output a signal to the first line SL1 having the time constant t1 larger than the time constant t2 of the second line SL2 at A time earlier than the B time.

Thus, without a difference in time constant, the first line SL1 and the second line SL2 may be driven with an identical voltage at an identical time.

As another example, when the first time constant related value SEN1 obtained by sensing the first line SL1 is larger than the second time constant related value SEN2 obtained by sensing the second line SL2, the controller 130 may control ☐) the driving circuit 120 to supply, to the first line SL1, a signal with a larger strength than a signal to be supplied to the second line SL2, ☐) the signal to be supplied to the first line SL1 by the driving circuit 120 to be over-driven, or ☐) the driving circuit 120 to supply, to the first line SL1, a signal with a larger over-drive voltage than a signal to be supplied to the second line SL2.

Thus, the driving circuit 120 may output, to the first line SL1, a signal with a larger strength than the second line SL2 or a signal that is more over-driven.

Meanwhile, as described above, in the display device 100 according to aspects of the present disclosure, a circuit (a panel driving circuit) for driving the stretchable display panel 110 may include a sensing circuit 800 sensing a time constant related value for all or at least one of the plurality of lines (SL, e.g., a plurality of data lines DL or a plurality of gate lines GL) disposed in the stretchable display panel 110, a driving circuit 120 supplying a signal (e.g., a data voltage, a scan signal, etc.) to all or at least one of the plurality of lines at a changed timing depending on the time constant related value obtained by sensing all or at least one of the plurality of lines, and supplying, to all or at least one of the plurality of lines, a signal with changed signal characteristics (e.g., signal strength, whether an over-drive is required, a magnitude of an over-drive voltage, etc.) depending on the time constant related value obtained by sensing all or at least one of the plurality of lines, and the like.

Figure 15:
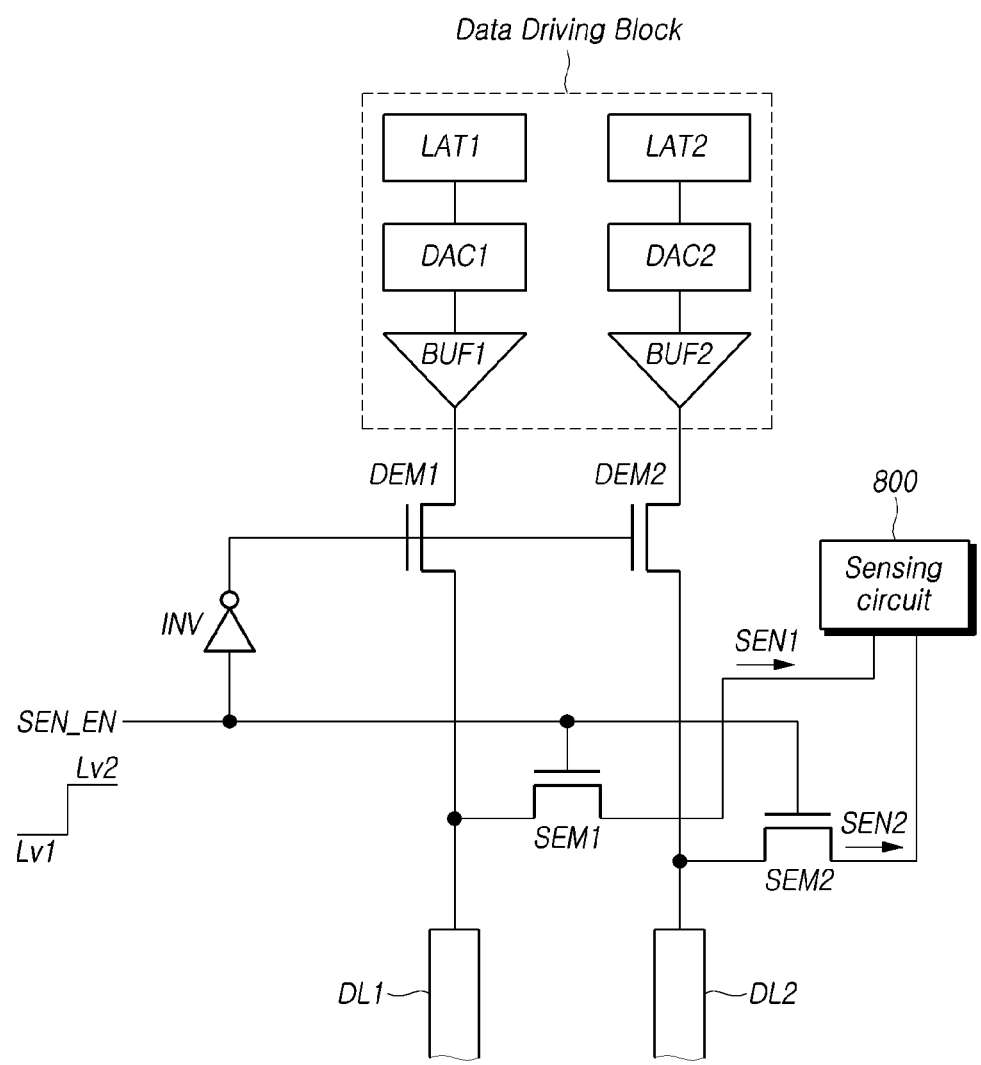
FIGS. 15 and 16 illustrate circuits for sensing a first data line and a second data line when the first data line and the second data line are stretched in the stretchable display device according to aspects of the present disclosure.
Figure 16:
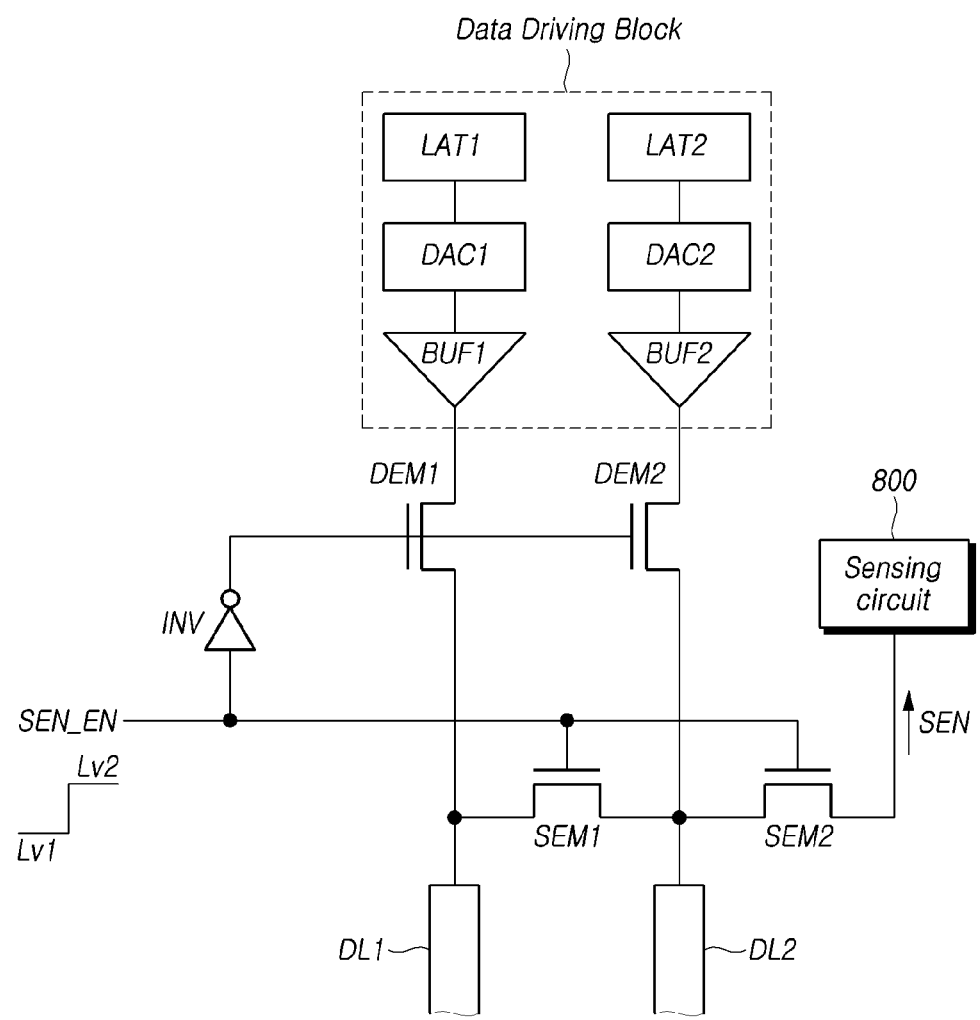

FIGS. 15 and 16 illustrate circuits for sensing a first data line DL1 and a second data line DL2 when the first data line DL1 and the second data line DL2 are stretched in the stretchable display device 100 according to aspects of the present disclosure. FIG. 15 shows a circuit for the individual sensing scheme. FIG. 16 shows a circuit for the group sensing scheme.

The plurality of lines SL disposed in the display panel 110 may include a plurality of data lines DL. When the display panel 110 is stretched, all or at least one of the plurality of data lines DL may be stretched. Hereinafter, for convenience of description, it is considered that both the first data line DL1 and the second data line DL2 are stretched.

As shown in FIG. 15, the sensing circuit 800 may sense individually each of the first data line DL1 and the second data line DL2.

An another example, as shown in FIG. 16, the sensing circuit 800 may connect the first data line DL1 to the second data line DL2, and sense the first data line DL1 and the second data line DL2 together.

Meanwhile, a data voltage as a signal for data driving is required to be applied to each of the first data line DL1 and the second data line DL2.

In order to drive each of the first data line DL1 and the second data line DL2, as shown in FIGS. 15 and 16, for each of the first data line DL1 and the second data line DL2, the data driving circuit 121 includes a driving block (data driving block) including one or more latch circuits LAT1 and LAT2 for storing image digital signals, one or more digital to analog converters DAC1 and DAC2 for converting the image digital signals to image analog signals, and one or more output buffers BUF1 and BUF2 for outputting the image analog signals as data voltages Vdata, or the like.

Meanwhile, driving (data driving) for each of the first data line DL1 and the second data line DL2 and sensing for the first data line DL1 and the second data line DL2 may be performed in a different time interval from each other.

Accordingly, when data driving is performed, the data lines DL1 and DL2 are required to be electrically connected to the data driving block, and when sensing is performed, the data lines DL1 and DL2 are required to be electrically connected to the sensing circuit 800.

Referring to FIG. 15, the stretchable display device 100 may further include a first sensing enable switch SEM1 for changing a connection state between the first data line DL1 and the sensing circuit 800 according to a sensing enable signal SEN_EN, a second sensing enable switch SEM2 for changing a connection state between the second data line DL2 and the sensing circuit 800 according to the sensing enable signal SEN_EN, a first driving enable switch DEM1 for changing a connection state between the first data line DL1 and a first output buffer BUF1 in the driving circuit 120, and a second driving enable switch DEM2 for changing a connection state between the second data line DL2 and a second output buffer BUF2 in the driving circuit 120.

On-off states of the first driving enable switch DEM1 and the second driving enable switch DEM2 may be the opposite of on-off states of the first sensing enable switch SEM1 and the second sensing enable switch SEM2.

Referring to FIG. 15, when the first sensing enable switch SEM1 and the second sensing enable switch SEM2 are turned on, the first data line DL1 and the second data line DL2 may be electrically connected to the sensing circuit 800 through different paths from each other.

In this case, the sensing circuit 800 may sense the first time constant related value SEN1 of the first line DL1 separately from the second time constant related value SEN2 of the second line DL2.

Referring to FIG. 16, the stretchable display device 100 may further include a first sensing enable switch SEM1 for changing a connection state between the first data line DL1 and the second data line DL2 according to a sensing enable signal SEN_EN, a second sensing enable switch SEM2 for changing a connection state between the first data line DL1 or the second data line DL2 and the sensing circuit 800 according to the sensing enable signal SEN_EN, a first driving enable switch DEM1 for changing a connection state between the first data line DL1 and a first output buffer BUF1 in the driving circuit 120, and a second driving enable switch DEM2 for changing a connection state between the second data line DL2 and a second output buffer BUF2 in the driving circuit 120.

On-off states of the first driving enable switch DEM1 and the second driving enable switch DEM2 may be the opposite of on-off states of the first sensing enable switch SEM1 and the second sensing enable switch SEM2.

Referring to FIG. 16, when the first sensing enable switch SEM1 is turned on, the first data line DL1 and the second data line DL2 are short-circuited. When the second sensing enable switch SEM2 is turned on, the first data line DL1 and the second data line DL2 are connected to the sensing circuit 800.

In this case, the sensing circuit 800 may sense one time constant related value SEN for two short-circuited data lines DL1 and DL2.

Referring to FIGS. 15 and 16, the first sensing enable switch SEM1 and the second sensing enable switch SEM2 are turned on, and the first data line DL1 and the second data line DL2 are turned off, when the sensing circuit 800 is needed to sense the first data line DL1 and the second data line DL2.

The first sensing enable switch SEM1 and the second sensing enable switch SEM2 are turned off, and the first data line DL1 and the second data line DL2 are turned on, when the data driving block is needed to drive the first data line DL1 and the second data line DL2.

The sensing enable signal SEN_EN may be changed from a first level Lv1 to a second level Lv2, when the sensing circuit 800 is needed to sense the first data line DL1 and the second data line DL2. The sensing enable signal SEN_EN may be changed from the second level Lv2 to the first level Lv1, when the data driving block is needed to drive the first data line DL1 and the second data line DL2.

Here, the first level Lv1 may be a low level voltage, and the second level Lv2 is a high level voltage. On the contrary, when the first sensing enable switch SEM1 and the second sensing enable switch SEM2 are P-type transistors, the first level Lv1 may be a high level voltage, and the second level Lv2 is a low level voltage.

Since on-off states of the first driving enable switch DEM1 and the second driving enable switch DEM2 are the opposite of on-off states of the first sensing enable switch SEM1 and the second sensing enable switch SEM2, referring to FIGS. 15 and 16, on-offs of the first driving enable switch DEM1 and the second driving enable switch DEM2 may be controlled by an inverted signal of the sensing enable signal SEN_EN.

Accordingly, an inverter circuit INV may be electrically connected between at least one gate node of the first driving enable switch DEM1 and the second driving enable switch DEM2 and at least one gate node of the first sensing enable switch SEM1 and the second sensing enable switch SEM2. Here, the inverter circuit INV may be an inverter, a NOT gate, etc.

Without using the inverter circuit INV, the first and second sensing enable switches SEM1 and SEM2 may be implemented by N-type transistors (or P-type transistors), and the first and second driving enable switches DEM1 and DEM2 may be implemented by P-type transistors (or N-type transistors). In this case, switching operations (on-off operations) of the first and second sensing enable switches SEM1 and SEM2 may be the opposite of switching operations (on-off operations) of the first and second driving enable switches DEM1 and DEM2.

In FIGS. 15 and 16, the first and second driving enable switches DEM1 and DEM2 may be located in the driving circuit 120, located in an edge area of the display panel 110, or located on the printed circuit.

The first and second sensing enable switches SEM1 and SEM2 may be located in the driving circuit 120, located in the sensing circuit 800, located in an edge area of the display panel 110, or located on the printed circuit.

The printed circuit may be electrically connected to the display panel 110 or to the driving circuit 120 and/or sensing circuit 800.

In FIG. 16 shows that the sensing circuit 800 can sense two data lines DL1 and DL2 together, but aspects of the present disclosure are not limited thereto. The sensing circuit 800 may sense three or more data lines together in order to increase sensing efficiency.

Figure 17:
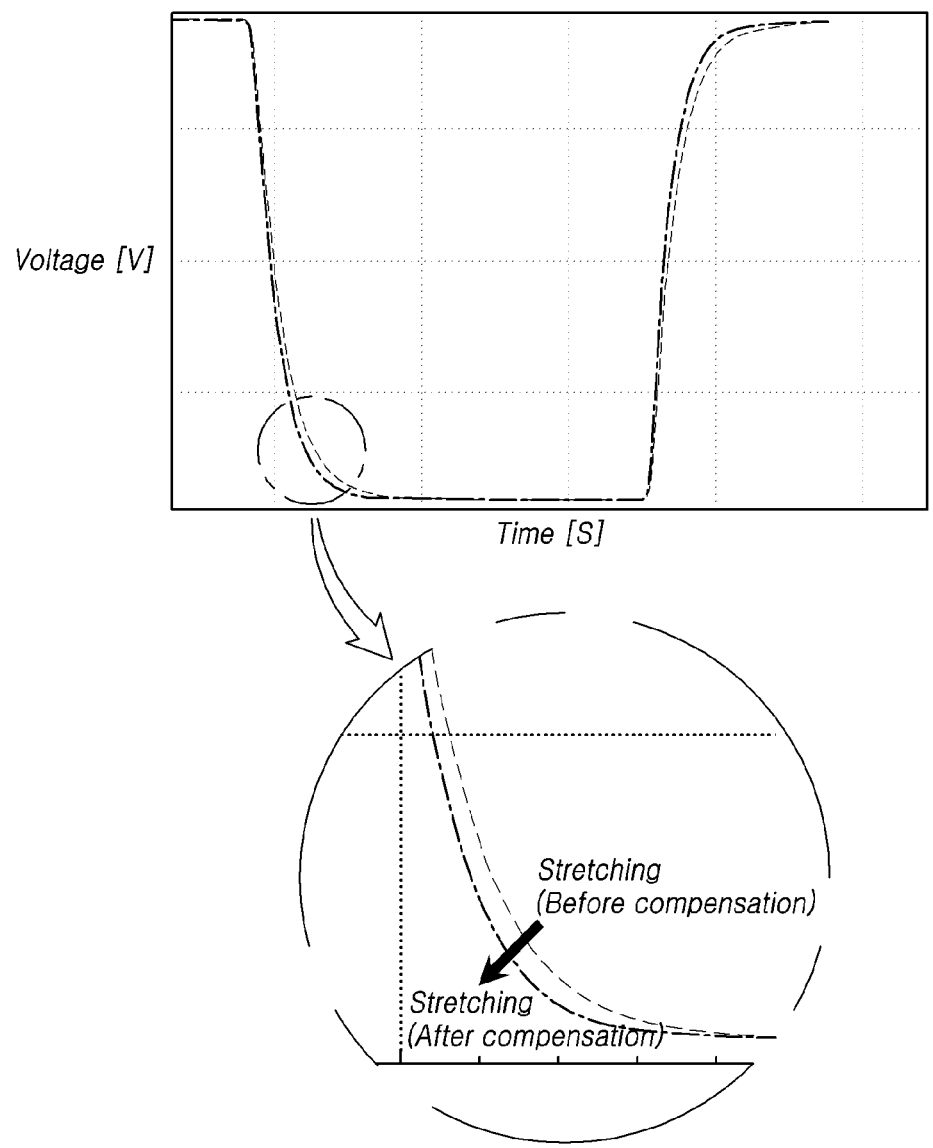
FIG. 17 illustrates an effect of improving a time constant of a line when the display panel is stretched, by controlling the driving of the line through the sensing of the time constant of the line in the stretchable display device according to aspects of the present disclosure.

FIG. 17 illustrates an effect of improving a time constant of a line when the display panel 110 is stretched, by controlling the driving of the line SL through the sensing of a time constant of the line SL in the stretchable display device 100 according to aspects of the present disclosure.

When the display panel 110 is stretched from the flat state, the time constant of the lines SL1 and SL2 can be larger, and therefore, it takes a longer time for a voltage input to one end of the lines SL1 and SL2 to reach a desirable level in the other end of the lines SL1 and SL2, such as, a level when the display panel is operated without being stretched or in the flat state.

According to driving methods described above, even when the display panel 110 is stretched and there occurs a variance/difference in time constant of the lines SL, it is possible to compensate the variance/difference in time constant of lines by controlling a driving timing of the lines SL or characteristics of a signal supplied to the lines SL.

After the variance/difference in time constant of lines SL has been compensated, as shown in FIG. 17, a voltage of a signal can reach a target level at more rapid time, compared to before compensating.

For example, in case signals with voltage waveforms as shown in FIG. 17 are scan signals SCAN1 and SCAN2 applied to a gate line GL, through compensating for a variance/difference in time constant of lines, driving timings or characteristics of the scan lines SCAN1 and SCAN2 may be controlled, and therefore the first and second transistors T1 and T2 shown in FIG. 4 may be turned on or turned off in a target timing. Thus, the same level of display quality of images can be provided before and after the stretching of the display panel 110.

Figure 18:
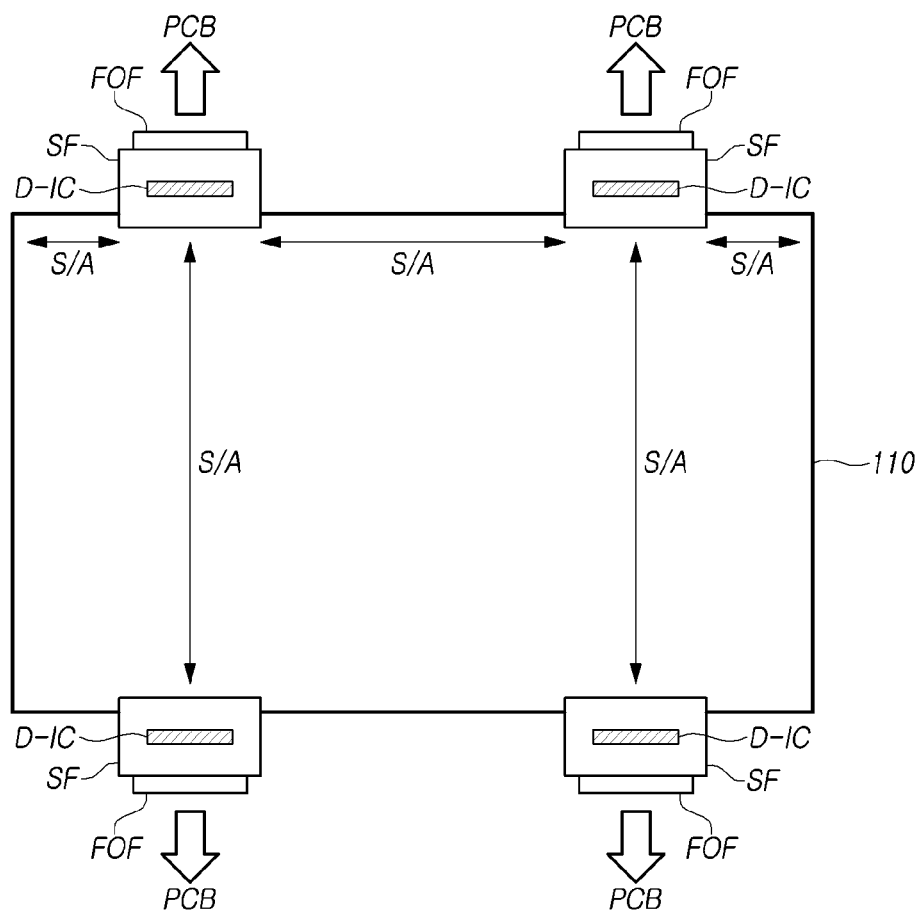
FIGS. 18 to 20 are diagrams schematically illustrating example implementations of the stretchable display device according to aspects of the present disclosure.
Figure 20:
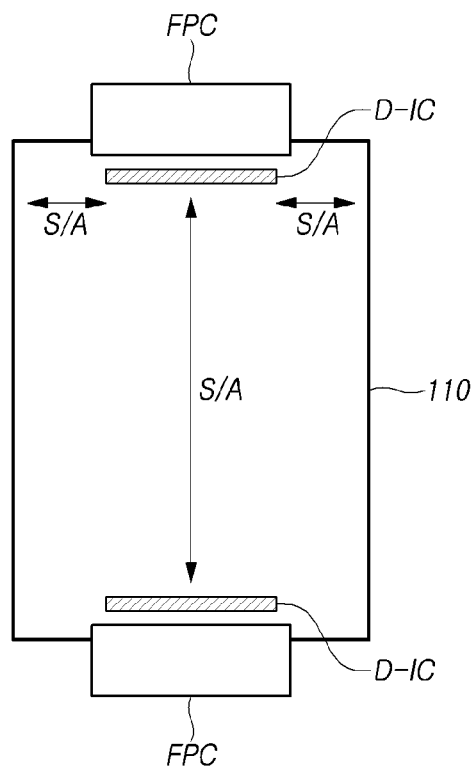

FIGS. 18 and 20 are diagrams schematically illustrating example implementations of the stretchable display device 100 according to aspects of the present disclosure.

Figure 19:
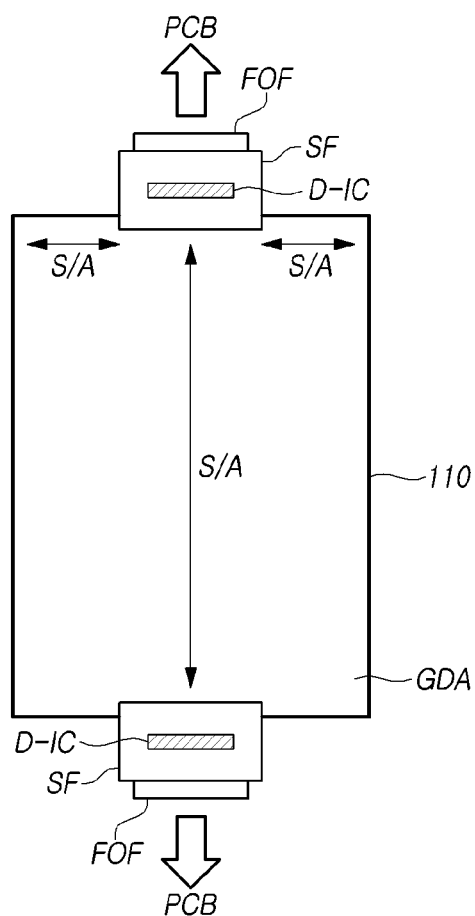

As shown in FIGS. 18 to 20, the driving circuit 120 may be implemented as one or more driving integrated circuit D-IC.

Referring to FIGS. 18 and 19, the one or more driving integrated circuit D-IC may be a chip on film (COF) type, be mounted on a circuit film SF that is bonded on an edge area of the display panel 110.

Referring to FIGS. 18 and 19, the circuit film SF on which the driving integrated circuit D-IC is mounted may be electrically connected to a printed circuit board (PCB). That is, both ends of the circuit film SF may be electrically connected to the display panel 110 and the printed circuit board (PCB) respectively.

The circuit film SF may be electrically connected to the printed circuit board (PCB) through a film on film (FOF).

Referring to FIG. 20, one or more driving integrated circuits D-IC may be implemented in a chip on glass (COF) type, and bonded on an edge area of the display panel 110.

In this case, a printed circuit (FPC) may be bonded in the edge area of the display panel 110.

Signal lines electrically connecting the printed circuit (FPC) and the driving integrated circuit D-IC may be disposed between an area in which the display panel 110 is bonded with the printed circuit (FPC) and an area in which the display panel 110 is bonded with the driving integrated circuit D-IC.

As shown in FIG. 18, the driving integrated circuit D-IC may be connected or located on a longer edge of the vertical edge and the horizontal edge of the display panel 110. This configuration may be applied to medium and large size displays.

As shown in FIGS. 19 and 20, the driving integrated circuit D-IC may be connected or located on a shorter edge of the vertical edge and the horizontal edge of the display panel 110. This configuration may be applied to small or mobile displays.

An area in which the driving integrated circuit D-IC is not located is an area at which the display panel 110 can be stretched. It is noted that a portion in which the driving integrated circuit D-IC is connected may interfere the stretching of the display panel 110.

Accordingly, there may occur an imbalance in stretching of the display panel 110 between the portion in which the driving integrated circuit D-IC is connected and an area in which the driving integrated circuit D-IC is not connected.

To overcome the imbalance of the stretching, the display device 100 according to aspects of the present disclosure may include at least two driving integrated circuits D-IC, and the at least two driving integrated circuits D-IC may be symmetrically disposed with respect to each other.

In other words, referring to FIGS. 18 to 20, the driving circuit 120 may include an even number of driving integrated circuits D-IC, and the even number of driving integrated circuits D-IC may be symmetrically located with respect to each other. For example, the even number of driving integrated circuits D-IC may be located symmetrically with respect to an intermediate portion between one side and the other side of the display panel 110.

Thus, it is possible to prevent the imbalance of the stretching, and prevent display quality of images from being reduced due to unbalanced stretching of the display panel 110.

According to aspects of the present disclosure, it is possible to provide a stretchable display device 100, a panel driving circuit capable of driving a stretchable display panel 110, and a method of driving the display device 100 or the panel driving circuit, for enabling original display quality of images to be maintained even when the display device 100 or the display panel 110 is stretched.

According to aspects of the present disclosure, it is possible to provide a stretchable display device 100, a panel driving circuit capable of driving a stretchable display panel 110, and a method of driving the display device 100 or the panel driving circuit, for enabling signal delivering performance of stretched lines SL to be maintained, even when the lines SL disposed in the display panel 110 is stretched, in case the display device 100 or the display panel 110 is stretched.

Here, the signal delivering performance of stretched lines SL may be determined by a time constant of the lines SL or a capacitance value or a resistance value for determining the time constant of the lines SL. For example, the smaller the time constant of the lines SL is, the greater the signal delivering performance can be. The smaller a difference in time constant of the lines SL is, the greater the signal delivering performance can be.

In accordance with aspects of the present disclosure, it is possible to provide a stretchable display device, a panel driving circuit capable of driving a stretchable display panel, and a method of driving the display device or the panel driving circuit, for enabling signal delivering performance of stretched lines to be maintained equally without a difference in signal delivering performance between the lines, even when there occurs a difference in whether the lines can be stretched or in how much the lines can be stretched according to a stretched location or a stretched direction of the display device or the display panel, in case the display device or the display panel is stretched.

The features, structures, configurations, and effects described in the present disclosure are included in at least one aspect but are not necessarily limited to a particular aspect. A person skilled in the art can apply the features, structures, configurations, and effects illustrated in the particular aspect to one or more other additional aspects by combining or modifying such features, structures, configurations, and effects. It should be understood that all such combinations and modifications are included within the scope of the present disclosure Although the exemplary aspects have been described for illustrative purposes, a person skilled in the art will appreciate that various modifications and applications are possible without departing from the essential characteristics of the present disclosure. For example, the specific components of the exemplary aspects may be variously modified. The scope of protection of the present disclosure should be construed based on the following claims, and all technical ideas within the scope of equivalents thereof should be construed as being included within the scope of the present disclosure.

What is claimed is:

1. A display device comprising:
    a stretchable display panel that includes a plurality of lines and a plurality of subpixels, and that is stretchable;
    a driving circuit driving the plurality of lines;
    a sensing circuit sensing a time constant related value of the plurality of lines, and outputting the sensed time constant related value; and
    a controller controlling the driving circuit, and controlling characteristics of a signal supplied to all or at least one of the plurality of lines to be changed according to the time constant related value obtained by sensing all or at least one of the plurality of lines, when the display panel has been stretched,
    wherein the characteristics of the signal is a magnitude of a normal voltage, a magnitude of an over-drive voltage or a magnitude of an under-drive voltage.

2. The display device according to claim 1, wherein the time constant related value includes at least one of a resistance value, a capacitance value, and a time constant value of all or at least one of the plurality of lines.

3. The display device according to claim 1, wherein the plurality of lines are formed of a stretchable material.

4. The display device according to claim 2, wherein in case of an individual sensing scheme, the time constant related value includes at least one of a resistance value, a capacitance value, and a time constant value of each of all or at least one of the plurality of lines.

5. The display device according to claim 2, wherein in case of a group sensing scheme, the time constant related value includes at least one of a resistance value, a capacitance value, and a time constant value of each group for all or at least one of the plurality of lines.

6. The display device according to claim 1, wherein the at least one of the plurality of lines includes a first line that is stretched with the display panel,
    wherein the sensing circuit outputs a first time constant related value obtained by sensing the first line,
    wherein the controller compares the first time constant related value with a first reference time constant value,
    outputs a control signal for enabling the driving circuit to drive the first line at an earlier timing than a reference driving timing when the first time constant related value is larger than the first reference time constant value, and
    outputs a control signal for enabling the driving circuit to drive the first line at a later timing than the reference driving timing when the first time constant related value is smaller than the first reference time constant value.

7. The display device according to claim 1, wherein the all or at least one of the plurality of lines includes a first line that is stretched with the display panel,
    wherein the sensing circuit outputs a first time constant related value obtained by sensing the first line,
    wherein the controller compares the first time constant related value with a first reference time constant value,
    controls the driving circuit to increase a magnitude of a signal to be supplied to the first line, the signal to be supplied to the first line by the driving circuit to be over-driven, or the driving circuit to increase an over-drive voltage of the signal to be supplied to the first line when the first time constant related value is larger than the first reference time constant value, and
    controls the driving circuit to reduce the magnitude of the signal to be supplied to the first line, the signal to be supplied to the first line by the driver circuit not to be over-driven, or the driving circuit to reduce the over-drive voltage of the signal to be supplied to the first line when the first time constant related value is smaller than the first reference time constant value.

8. The display device according to claim 1, wherein the all or at least one of the plurality of lines includes a first line and a second line that are stretched with the display panel,
    wherein the sensing circuit outputs a first time constant related value obtained by sensing the first line, and a second time constant related value obtained by sensing the second line, and
    wherein the first time constant related value is larger than the second time constant related value, the controller outputs a control signal for enabling the driving circuit to drive the first line at an earlier timing than the second line.

9. The display device according to claim 1, wherein the all or at least one of the plurality of lines includes a first line and a second line that are stretched with the display panel,
    wherein the sensing circuit outputs a first time constant related value obtained by sensing the first line, and a second time constant related value obtained by sensing the second line, and
    wherein the controller controls a magnitude of a signal to be supplied to the first line to be larger than a magnitude of a signal to be supplied to the second line, the signal to be supplied to the first line to be over-driven and a signal to be supplied to the second line not to be over-driven, or an over-drive voltage of the signal to be supplied to the first line to be larger than an over-drive voltage of the signal to be supplied to the second line when the first time constant related value is larger than the second time constant related value.

10. The display device according to claim 1, wherein each of the plurality of subpixels includes:
    an organic light emitting diode;
    a driving transistor electrically connected between the first electrode of the organic light emitting diode and a driving voltage line; and
    a first transistor controlled by a scan signal supplied through a gate line, and electrically connected between a gate node of the driving transistor and a data line,
    wherein each of the all or at least one of the plurality of lines is one of the data line, the driving voltage line and the gate line.

11. The display device according to claim 1, wherein the all or at least one of the plurality of lines include a first data line and a second data line, and the display device further includes:
    a first sensing enable switch for changing a connection state between the first data line and the sensing circuit according to a sensing enable signal;
    a second sensing enable switch for changing a connection state between the second data line and the sensing circuit according to the sensing enable signal;
    a first driving enable switch for changing a connection state between the first data line and a first output buffer in the driving circuit; and
    a second driving enable switch for changing a connection state between the second data line and a second output buffer in the driving circuit, wherein on-off states of the first driving enable switch and the second driving enable switch are opposite of on-off states of the first sensing enable switch and the second sensing enable switch.

12. The display device according to claim 1, wherein the all or at least one of the plurality of lines include a first data line and a second data line, and the display device further includes:
a first sensing enable switch for changing a connection state between the first data line and the second data line according to the sensing enable signal;
a second sensing enable switch for changing a connection state between the first data line or the second data line and the sensing circuit according to the sensing enable signal,
a first driving enable switch for changing a connection state between the first data line and the first output buffer in the driving circuit; and
a second driving enable switch for changing a connection state between the second data line and the second output buffer in the driving circuit,
wherein on-off states of the first driving enable switch and the second driving enable switch are opposite of on-off states of the first sensing enable switch and the second sensing enable switch.

13. The display device according to claim 11, wherein the display device further includes an inverter circuit electrically connected between gate nodes of the first driving enable switch and the second driving enable switch and gate nodes of the first sensing enable switch and the second sensing enable switch.

14. The display device according to claim 1, wherein the display panel has a symmetrical structure.

15. A method of driving a stretchable display device including a display panel including a plurality of lines, and a driving circuit for driving the plurality of lines, the method comprising:
sensing a time constant related value of all or at least one of the plurality of lines, at a line sensing step; and
controlling characteristics of a signal supplied to the all or at least one of the plurality of lines to be changed, at a driving control step when the display panel is stretched according to the time constant related value obtained by sensing at least one of the plurality of lines,
wherein the characteristics of the signal is a magnitude of a normal voltage, a magnitude of an over-drive voltage or a magnitude of an under-drive voltage.

16. The method according to claim 15, wherein the time constant related value includes at least one of a resistance value, a capacitance value, and a time constant value of all or at least one of the plurality of lines.

17. The method according to claim 15, further comprising:
prior to the line sensing step, generating a stretch event signal by sensing whether the display panel is stretched or a stretched location based on an input signal, at a display panel stretch sensing step.

18. The method according to claim 17, wherein the line sensing step comprises selectively sensing one or more lines corresponding to the stretched location sensed in the display panel stretch sensing step.

19. The method according to claim 15, further comprising: after the line sensing step, determining whether the display panel is stretched or determining a location where the display panel is stretched, based on the time constant related value obtained by sensing the all or at least one of the plurality of lines, at a display panel stretch determination step.

20. The method according to claim 15, wherein in the line sensing step, the time constant related value of all or at least one of the plurality of lines includes a first time constant related value of a first line that is stretched with the display panel,
wherein the driving control step further comprises:
comparing the first time constant related value with a first reference time constant value;
outputting a control signal for enabling the driving circuit to drive the first line at an earlier timing than a reference driving timing when the first time constant related value is larger than the first reference time constant value; and
outputting a control signal for enabling the driving circuit to drive the first line at a later timing than the reference driving timing when the first time constant related value is smaller than the first reference time constant value.

21. The method according to claim 15, wherein in the line sensing step, the time constant related value of all or at least one of the plurality of lines includes a first time constant related value of a first line that is stretched with the display panel,
wherein the driving control step further comprises:
comparing the first time constant related value with a first reference time constant value;
when the first time constant related value is larger than the first reference time constant value, controlling a magnitude of a signal to be supplied to the first line to be larger, the signal to be supplied to the first line to be over-driven, or an over-drive voltage of the signal to be supplied to the first line to be larger; and
when the first time constant related value is smaller than the first reference time constant value, controlling i) the magnitude of the signal to be supplied to the first line to be smaller, ii) the signal to be supplied to the first line not to be over-driven, or iii) the over-drive voltage of the signal to be supplied to the first line to be smaller.

22. The method according to claim 15, wherein in the line sensing step, the time constant related value of all or at least one of the plurality of lines includes a first time constant related value obtained by sensing a first line and a second time constant related value obtained by sensing a second line,
wherein the driving control step further comprises:
outputting a control signal for enabling the driving circuit to drive the first line at an earlier timing than the second line when the first time constant related value is larger than the second time constant related value.

23. The method according to claim 15, wherein in the line sensing step, the time constant related value of all or at least one of the plurality of lines includes a first time constant related value obtained by sensing a first line and a second time constant related value obtained by sensing a second line,
wherein the driving control step further comprises:
controlling a magnitude of a signal to be supplied to the first line to be larger than a magnitude of a signal to be supplied to the second line, the signal to be supplied to the first line to be over-driven and a signal to be supplied to the second line not to be over-driven, or an over-drive voltage of the signal to be supplied to the first line to be larger than an over-drive voltage of the signal to be supplied to the second line when the first time constant related value is larger than the second time constant related value.

24. A panel driving circuit for driving a stretchable display panel comprising:
- a sensing circuit sensing a time constant related value of all or at least one of a plurality of lines disposed in the display panel; and
- a driving circuit supplying a signal with changed characteristics depending on the time constant related value obtained by sensing the all or at least one of the plurality of lines to the at least one of the plurality of line,
- wherein the characteristics of the signal is a magnitude of a normal voltage, a magnitude of an over-drive voltage or a magnitude of an under-drive voltage.

25. The panel driving circuit according to claim 24, wherein the time constant related value includes at least one of a resistance value, a capacitance value, and a time constant value of all or at least one of the plurality of lines.

26. The panel driving circuit according to claim 24, wherein the driving circuit outputs the signal at the at least one of the plurality of lines that has a large time constant related value due to the stretching of the display panel at an earlier timing than the signal before the stretching of the display panel.

27. The panel driving circuit according to claim 24, wherein the driving circuit outputs the signal at the at least one of the plurality of lines that has a large time constant related value due to stretching of the display panel, with a larger strength than before the stretching of the display panel.

28. The panel driving circuit according to claim 24, wherein the driving circuit outputs the signal at the at least one of the plurality of lines that has a large time constant related value due to stretching of the display panel, with a larger over-drive voltage than before the stretching of the display panel.

* * * * *